US008652763B2

(12) United States Patent
Jain et al.

(10) Patent No.: US 8,652,763 B2
(45) Date of Patent: Feb. 18, 2014

(54) METHOD FOR FABRICATING DUAL DAMASCENE PROFILES USING SUB PIXEL-VOTING LITHOGRAPHY AND DEVICES MADE BY SAME

(75) Inventors: Kanti Jain, Urbana, IL (US); Uttam Reddy, Burr Ridge, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 867 days.

(21) Appl. No.: 11/847,134

(22) Filed: Aug. 29, 2007

(65) Prior Publication Data

US 2009/0023098 A1 Jan. 22, 2009

Related U.S. Application Data

(60) Provisional application No. 60/950,020, filed on Jul. 16, 2007.

(51) Int. Cl.
*G03F 7/20* (2006.01)
(52) U.S. Cl.
USPC .......................................................... 430/314
(58) Field of Classification Search
USPC .................... 430/311, 313, 394, 314, 319
See application file for complete search history.

(56) References Cited

U.S. PATENT DOCUMENTS

| | | | |
|---|---|---|---|
| 4,334,349 A | 6/1982 | Aoyama et al. | |
| 4,414,059 A | 11/1983 | Blum et al. | |
| 4,700,462 A | 10/1987 | Beaubien et al. | |
| 4,780,177 A | 10/1988 | Wojnarowski et al. | |
| 4,842,677 A | 6/1989 | Wojnarowski et al. | |
| 4,865,873 A | 9/1989 | Cole et al. | |
| 4,877,644 A | 10/1989 | Wu et al. | |
| 4,959,326 A | 9/1990 | Roman et al. | |
| 5,053,348 A | 10/1991 | Mishra et al. | |
| 5,155,053 A | 10/1992 | Atkinson | |
| 5,232,549 A | 8/1993 | Cathey et al. | |

(Continued)

FOREIGN PATENT DOCUMENTS

| | | |
|---|---|---|
| TW | 0488028 B | 5/2002 |
| WO | WO 2005/086982 | 9/2005 |
| WO | 2009/005863 | 1/2009 |

OTHER PUBLICATIONS

Chae et al. (2007) "Patterning of Indium Tin Oxide Projection Photoblation and Lift-Off Process for Fabrication of Flat-Panel Displays," *Appl. Phys. Lett.* 90:261102.

(Continued)

*Primary Examiner* — Brittany Raymond
(74) *Attorney, Agent, or Firm* — Lathrop & Gage LLP

(57) ABSTRACT

This invention provides processing steps, methods and materials strategies for making patterns of structures for integrated electronic devices and systems. Processing methods of the present invention are capable of making micro- and nano-scale structures, such as Dual Damascene profiles, recessed features and interconnect structures, having non-uniform cross-sectional geometries useful for establishing electrical contact between device components of an electronic device. The present invention provides device fabrication methods and processing strategies using sub pixel-voting lithographic patterning of a single layer of photoresist useful for fabricating and integrating multilevel interconnect structures for high performance electronic or opto-electronic devices, particularly useful for Very Large Scale Integrated (VLSI) and Ultra large Scale Integrated (ULSI) devices. Processing methods of the present invention are complementary to conventional microfabrication and nanofabrication methods for making integrated electronics, and can be effectively integrated into existing photolithographic, etching, and thin film deposition patterning systems, processes and infrastructure.

51 Claims, 10 Drawing Sheets

(56) References Cited

U.S. PATENT DOCUMENTS

| | | | |
|---|---|---|---|
| 5,285,236 A | | 2/1994 | Jain |
| 5,514,618 A | | 5/1996 | Hunter, Jr. et al. |
| 5,679,472 A | | 10/1997 | Wu et al. |
| 5,702,565 A | | 12/1997 | Wu et al. |
| 5,908,719 A | | 6/1999 | Guckel et al. |
| 5,936,707 A | * | 8/1999 | Nguyen et al. ............... 355/18 |
| 5,976,968 A | | 11/1999 | Dai |
| 6,007,324 A | * | 12/1999 | Tzu et al. ........................ 430/5 |
| 6,140,226 A | | 10/2000 | Grill et al. |
| 6,277,318 B1 | | 8/2001 | Bower et al. |
| 6,289,751 B1 | | 9/2001 | Mathur et al. |
| 6,348,295 B1 | | 2/2002 | Griffith et al. |
| 6,355,399 B1 | | 3/2002 | Sajan et al. |
| 6,403,456 B1 | | 6/2002 | Plat et al. |
| 6,448,176 B1 | | 9/2002 | Grill et al. |
| 6,495,448 B1 | | 12/2002 | Lee |
| 6,593,687 B1 | | 7/2003 | Pei et al. |
| 6,635,404 B1 | | 10/2003 | Choi et al. |
| 6,714,810 B2 | | 3/2004 | Grzeszczuk et al. |
| 6,717,650 B2 | | 4/2004 | Jain |
| 6,962,771 B1 | | 11/2005 | Liu et al. |
| 6,988,925 B2 | | 1/2006 | Arthur et al. |
| 7,078,351 B2 | | 7/2006 | Chiu et al. |
| 7,095,484 B1 | | 8/2006 | Fries |
| 7,167,296 B2 | | 1/2007 | Meisburger |
| 7,180,575 B2 | | 2/2007 | Kasumi et al. |
| 7,196,005 B2 | | 3/2007 | Ho |
| 7,264,990 B2 | | 9/2007 | Rueckes et al. |
| 2001/0042917 A1 | * | 11/2001 | Pramanick et al. ............ 257/751 |
| 2003/0206281 A1 | * | 11/2003 | Jain ............................... 355/53 |
| 2004/0125254 A1 | | 7/2004 | Chae et al. |
| 2005/0064728 A1 | | 3/2005 | Yang |
| 2005/0067286 A1 | | 3/2005 | Ahn et al. |
| 2005/0089763 A1 | * | 4/2005 | Tan et al. .......................... 430/5 |
| 2005/0147895 A1 | | 7/2005 | Chang et al. |
| 2005/0158668 A1 | | 7/2005 | Bitter et al. |
| 2005/0185891 A1 | | 8/2005 | Kim et al. |
| 2006/0063351 A1 | | 3/2006 | Jain |
| 2006/0099731 A1 | | 5/2006 | Buckley et al. |
| 2006/0188721 A1 | | 8/2006 | Irvin, Jr. et al. |
| 2006/0223245 A9 | | 10/2006 | Pellens et al. |
| 2006/0256307 A1 | | 11/2006 | Fries |
| 2006/0289976 A1 | | 12/2006 | Min |
| 2007/0003878 A1 | | 1/2007 | Paxton et al. |
| 2007/0134420 A1 | | 6/2007 | Koberstein et al. |
| 2008/0020565 A1 | * | 1/2008 | Tseng et al. ................... 438/633 |
| 2008/0176398 A1 | | 7/2008 | Jain et al. |
| 2009/0023098 A1 | | 1/2009 | Jain et al. |
| 2009/0239042 A1 | | 9/2009 | Jain et al. |

OTHER PUBLICATIONS

Chae et al. (Jan. 29, 2008) "Excimer Laser Projection Photoblation and Lift-Off Process for Patterning of Indium-Tin-Oxide for Cost Effective Fabrication of Flat-Panel Displays," *Proc. SPIE* 6911:69110P.
Chen et al. (Nov. 1999) "Electron Beam Lithography Process for T- and Γ-Shaped Gate Fabrication Using Chemically Amplified DUV Resists and PMMA," *J. Vac. Sci. Technol. B*. 17(6):2507-2511.
Chen et al. (2002) "Thin Film Patterning by Laser Lift-Off," *Jpn. J. Appl. Phys*. 41:3099-3100.
Choi et al. (2001) "Electrophoresis Deposition of Carbon Nanotubes for Triode-Type Field Emission Display," *Appl. Phys. Lett*. 78(11):1547-1549.
Choi et al. (1999) "Fully Sealed, High-Brightness Carbon-Nanotube Field-Emission Display," *Appl. Phys. Lett*. 75(20):3129-3131.
Dharap et al. (2004) "Nanotube Film Based on Single-Wall Carbon Nanotubes for Strain Sensing," *Nanotech*. 15:379-382.
Duley et al. (1996) "Interactions and Effects in Semiconductors," In; *UV Lasers: Effects and Applications in Materials Science*, Cambridge University Press, Cambridge, UK, pp. 308-356.
Fennimore et al. (Jul. 24, 2003) "Rotational Actuators Based on Carbon Nanotubes," *Nature* 424:408-410.

Grunbacher et al. (Jan. 1997) "Single Step Lithography for Double-Recessed Gate Pseudomorphic High Electron Mobility Transistors," *J. Vac. Sci. Technol. B* 15(1):49-52.
Hayes et al. (2001) "A Laser-Ablation and Lift-Off Technique for Fabricating Simple Microfluidic Devices," *Proc. SPIE* 4236:115-125.
Huemoeller et al. (Jun. 2007) "Unveiling the Next Generation in Integrated Circuit Substrate Circuit Formation," *CircuiTree* 20(6):12-.
Hwu et al. (2003) "A Novel Double-Recesses 0.2-μm T-Gate Process for Heterostructure InGap-InGaAs Doped-Channel FET Fabrication," *IEEE Electron. Dev. Lett*. 24(6):381-383.
Jain, K. (1990) "Excimer Laser Etching and Deposition," In; *Excimer Laser Lithography*, SPIE Press, Bellingham, WA, pp. 176-189.
Jain et al. (Aug. 2005) "Flexible Electronics and Displays: High-Resolution, Roll-to-Roll, Projection Lithography and Photoablation Processing Technologies for High-Throughput Production," *Proc. IEEE* 93(8):1500-1510.
Jain et al. (Oct. 2002) "Large-Area, High-Resolution Lithography and Photoablation Systems for Microelectronics and Optoelectronics Fabrication," *Proc. IEEE* 90(10):1681-1688.
Jain et al. (Aug. 2002) "Large-Area Excimer Laser Lithography and Photoablation Systems," *Microlithography World* 11(3):8-10.
Klosner et al. (Jul. 2002) "High Resolution, Large Area Projection Lithography Offers a New Alternative for Wafer-Level Packaging," *Chip Scale Review* 6(4):75.
Kocabas et al. (2007) "Experimental and Theoretical Studies of Transport Through Large Scale, Partially Aligned Arrays of Single-Walled Carbon Nanotubes in Thin Film Type Transistors," *Nano Lett*. 7(5):1195-1202.
Lee et al. (Jul. 2005) "Sub-50 nm T-Gate Pseudomorphic HEMTs Using Low Temperature Development Method," *Proceedings of 2005 5th IEEE Conference on Nanotechnology*, Nagoya, Japan, Jul. 2005.
Lee et al. (Jul. 2006) "Process for 20nm T Gate on $Al_{0.25}Ga_{0.75}As/In_{0.2}Ga_{0.8}As$/GaAs Epilayer Using Two-Step Lithography and Zig-zag Foot," *J. Vac. Sci. Technol. B* 24(4):1869-1872.
Lin et al. (Jul. 2004) "Single Step Electron-Beam Lithography for Asymmetric Recess and Gamma Gate in High Electron Mobility Transistor Fabrication," *J. Vac. Sci. Technol. B* 22(4):1723-1726.
Liu et al. (Nov. 12, 2001) "Carbon Nanotube Field-Effect Inverters," *Appl. Phys. Lett*. 79:3329-3331.
Lu et al. (Jun. 21, 2006) "Nanotube Micro-Optomechanical Actuators," *Appl. Phys. Lett*. 88:253107.
Lu et al. (1995) "Laser-Induced Dry Lift-Off Process," *Jpn. J. Appl. Phys*. 34:L1669-L1670.
Mancini et al. (Aug. 2002) "T-Gate Fabrication for GaAs Processing," *Microthithography World*.
Martel, R. (2002) "Nanotube Electronics: High-Performance Transistors," *Nature. Mat*. 1:203-204.
Meitl et al. (2004) "Solution Casting and Transfer Printing Single-Walled Carbon Nanotube Films," *Nano Lett*. 4(9):1643-1647.
Molpeceres et al. (2005) "Microprossessing of ITO and a-Si Thin Films Using ns Laser Sources," *J. Micromech. Microeng*. 15:1271-1278.
Oh et al. (2003) "Room Temperature Fabrication of High Resolution Carbon Nanotube Field-Emission Cathodes by Self-Assembly," *Appl. Phys. Lett*. 82(15):2521-2523.
Pasquier et al. (Nov. 10, 2005) "Conducting and Transparent Single-Wall Carbon Nanotube Electrodes for Polymer-Fullerene Solar Cells," *Appl. Phys. Lett*. 87:203511.
Robin et al. (Nov. 2000) "Evolutionary Optimization of the Electron-Beam Lithography Process for Gate Fabrication of High Electron Mobility Transistors," *J. Vac. Sci. Technol. B* 18(6):3445-3449.
Srinivasan et al. (Sep. 15, 1982) "Self-Developing Photoetching of Poly(ethylene Terephthalate) Films by Far-Ultraviolet Excimer Laser Radiation," *Appl. Phys. Lett*. 41:576.
Tabatabaie-Alavi et al. (Aug. 2003) "Evolution of T-Shaped Gate Lithography for Compound Semiconductors Field-Effect Transistors," *IEEE Trans. Semicon. Manufac*. 16(3):365-369.
Thompson et al. (Nov. 1990) "High Aspect Ratio Asymmetric Gate Structures Employed in Novel Self-Aligned Electron Mobility Transistor Technology," *J. Vac. Sci. Technol. B* 8(6):1339-1342.

(56) References Cited

OTHER PUBLICATIONS

Yavas et al. (1999) "High-Speed Maskless Laser Patterning of Thin Films for Giant Microelectronics," *Jpn. J. Appl. Phys.* 38:7131-7134.

Yavas et al. (1999) "Effect of Substrate Absorption on the Efficiency of Laser Patterning of Indium Tin Oxide Thin Films," *J. Appl. Physi.* 85(8):4207-4212.

International Search Report, Corresponding to International Application No. PCT/US07/78516, Mailed Mar. 27, 2008.

Lee et al. (Jul. 2005) "Sub-50 nm T-Gate Pseudomorphic HEMTs Using Low Temperature Development Method," *Proceedings of 2—5 5th IEEE Conference on Nanotechnology*, Nagoya, Japan.

Written Opinion, Corresponding to International Application No. PCT/US07/78516, Completed Jan. 24, 2008.

International Search Report, Corresponding to International Application No. PCT/US08/69635, Mailed Sep. 30, 2008.

Search Report and Written Opinion corresponding to International Application No. PCT/US2008/59173 (filed Apr. 2, 2008), a related application, dated Dec. 9, 2008, 7 pp.

Klosner et al. (Apr. 12, 2004) "Massively parallel, large-area maskless lithography," Applied Physics Letters 84(15):2880-2882, American Institute of Physics.

* cited by examiner

METHOD FOR FABRICATING DUAL DAMASCENE PROFILES USING SUB PIXEL-VOTING LITHOGRAPHY AND DEVICES MADE BY SAME

CROSS-REFERENCE TO RELATED APPLICATIONS

This application claims priority under 35 U.S.C. 119(e) to U.S. provisional Patent Application 60/950,020 filed Jul. 16, 2007, which is hereby incorporated by reference in its entirety to the extent not inconsistent with the present description.

STATEMENT REGARDING FEDERALLY SPONSORED RESEARCH OR DEVELOPMENT

Not applicable.

BACKGROUND OF INVENTION

Consumer demand for electronic devices capable of high operating speeds continues to provide significant motivation for the development of integrated circuits capable of enhanced device performance. Advanced lithographic and direct writing patterning techniques, for example, currently enable microprocessor designs having large scale integration of 10 s to 100 s of millions of microsized device components in dense multilevel configurations. Critical to practical implementation of such high density device geometries, however, is the development of interconnect structures capable of establishing effective electrical interconnection of functional device components in and between individual device levels of a multilayer electronic device. Commonly, a complex pattern of interconnects and vias in these devices provides a communication mechanism between functional components of the device. The electrical resistance and parasitic capacitance associated with such complex interconnect structures is currently a significant factor in the circuit speeds attainable in modern microprocessor systems. Accordingly, significant research is currently directed toward developing new device geometries, materials and processing strategies for making multilevel interconnects for dense integrated circuits.

Dual Damascene (DD) processing provides an effective means of making complex multilayer metal structures in low-k dielectric materials useful as interconnects in advanced, high performance integrated circuits. In this process, multilevel recessed features comprising interconnected horizontal trenches and vertical via structures are generated in a low-K dielectric layer (e.g., k<3.0)) provided on a substrate using a combination of lithographic pattering and etching techniques. Typically, trenches are etched to a depth of 400 to 500 nanometers and vias are etched to a depth of 500 to 800 nanometers. Trench and via structures are filled in a single metal deposition step followed by chemical mechanical polishing to generate inlaid metal structures capable of establishing intra-level electrical contact between device components occupying a given device level and inter-level electrical contact between device components provided on different device levels. Metal filled trench structures, for example, may provide for wiring of functional device components provided on a given device level, and metal filled via structures may provide contacts for electrically connecting different levels in a device. Copper is a commonly used metal for Dual Damascene interconnect structures, but attention is currently being given to incorporate higher conductivity metals, such as silver, that are less susceptible to diffusion into low k dielectric materials. As a versatile processing platform, Dual Damascene processing is compatible with iterative process implementation on a single device substrate so as to access complex multilayer structures useful for interconnecting a desired number (e.g., eight or more) of individual device levels.

A number of important advantages are provided by the Dual Damascene processing platform. First, this process is compatible with fabrication of low resistance interconnect structures comprising copper as the conducting material. This aspect of Dual Damacene processing is beneficial because alternative plasma etching patterning techniques are generally unavailable and/or unfeasible for patterning copper interconnect structures. Second, use of a single metal deposition step for fabricating trench and via structures provides an accurate means of aligning and registering trench and via structures of an interconnect, thereby minimizing problems arising from device component misalignment. Third, Dual Damascene processing realizes a net reduction in the total number of processing steps required for interconnect formation compared to conventional interconnect fabrication approaches. Defining trench and via structures via Dual Damascene methods requires a single lithographic alignment step and a single deposition step for simultaneously filing both vias and trenches. As a result of these benefits, Dual Damascene processing continues to achieve wide commercial implementation, particularly with respect to Very Large Scale Integrated (VLSI) and Ultra large Scale Integrated (ULSI) devices, such as complementary high performance metal oxide semiconductor (CMOS) devices.

Although current Dual Damascene approaches reduce the total number of processing steps required to make complex multilevel interconnect structures, this fabrication technique still requires a significant number of discrete processing steps (e.g., 20-30) per layer of a multilayer electronic device. A significant component of the processing steps required for Dual Damascene processing currently involves defining trench and via structures in the Dual Damascene profile. There are two primary fabrication schemes for making Dual Damascene profiles in a dielectric layer, (i) the Trench First Dual Damascene process, and (ii) the Via First Dual Damascene process. A Self Aligned Dual Damascene process has also been developed providing an alternative processing route for making Dual Damascene profiles. This process employs a complex fabrication sequence relative to Trench First and Via First processes, however, and is currently not significantly implemented for main stream manufacturing of semiconductor devices.

Trench First and Via First Dual Damascene processing techniques each typically employ a stack of at least three discrete layers of dielectric material comprising a bottom most dielectric layer, etch stop layer and outer most dielectric layer. The bottom most layer is provided on the device substrate. Via structures are etched in this bottom most layer which is typically a silicon dioxide or other low k dielectric material layer having a thickness of 500-700 nm. The etch stop layer, typically consisting of a thin layer of silicon nitride (usually about 30 nm), is provided on top of the bottom most layer. Finally, an outer most dielectric layer is provided on top of the etch stop layer. Trench structures are etched in this outermost dielectric layer, which typically consists a silicon dioxide or other low k dielectric layer having a thickness 400-500 nm.

In the Trench First Dual Damascene fabrication procedure, trenches are first defined in the outermost layer of dielectric material. In an embodiment, for example, a layer of photoresist is first applied on the wafer having the stack of three dielectric layers. A trench pattern is transferred on to the resist using optical lithography. Commonly, a deep UV source or an i-line source is used, depending on the desired trench feature sizes. Once the pattern is exposed, the wafer is immersed in a developer solution, clearing away the exposed regions. The wafer is then anisotropically etched, for example using reactive ion etching (RIE). In this processing step, trench features are etched in the outermost dielectric layer down to the etch stop layer provided between outermost and bottom most dielectric layers of the stack After etching processing is completed, the photoresist is stripped and a second layer of resist is applied on to the dielectric layer stack having the pattern of trench features. The second photoresist layer is patterned corresponding to the via structures after alignment with the trenches etched into the outermost dielectric layer. After development processing, the vias structures are generated via anisotropic etching, for example using reactive ion etching (RIE), wherein the vias extend into the bottom most dielectric layer.

In contrast to the Trench First Dual Damascene fabrication procedure, via structures are patterned before the trench structures in the Via First Dual Damascene fabrication procedure. In this process, the wafer is first coated with a layer of resist and a pattern of a photomask corresponding to the vias is transferred on to the resist using optical lithography. After development of the exposed layer of photoresist, via structures are anisotropically etched completely through the three layer dielectric stack. Once the vias are patterned, a second layer of photoresist is applied to the surface of the dielectric stack having the etched vias structures. The second photoresist layer is patterned using optical lithography to define the trench structures. Upon development of the patterned second photoresist layer, trench structures are etched down to the etch stop layer via anisotropic etching.

Trench First and Via First Dual Damascene techniques are susceptible to a number of disadvantages. First, use of multiple resist processing steps adds considerably to the cost of commercial implementation, as the overall cost of semiconductor device fabrication increases at an exponential rate with the number of resist deposition, patterning developing steps in a given process. Second, Trench First and Via First Dual Damascene require two separate anisotropic etch processing sequences which decreases overall throughput and also significantly increases cost of this fabrication method. Finally, the Trench First Dual Damascene fabrication procedure requires that a second layer of resist be applied onto the wafer after defining and etching the trench structures. Since the resist is commonly in the liquid phase it fills the trench structures etched into the outermost dielectric layer, and therefore, commonly does not form a uniform layer of photoresist if applied too thin. In order to get a uniform coating, the resist layer commonly needs to be very thick, which commonly impedes forming very fine and/or high resolution features of the via structures in the dielectric material.

Given practical limitations of Trench First and Via First techniques employing multiple photoresist processing steps, substantial motivation exists for development of methods for generating Dual Damascene structures using single layer photoresist processing. U.S. Pat. No. 6,355,399 discloses methods using a gray tone mask to form Dual Damascene profiles in a single masking and etch step involving one exposure step. In this method, the intensity of electromagnetic radiation transmitted by a gray scale mask is spatially modified selectively so as to define via and trench structures in a single layer of photoresist. A single resist layer is patterned using the grayscale photomask and, the pattern in the photoresist is subsequently transferred to a dielectric device layer to form via structures corresponding to completely transmissive regions of the photomask and trench structures corresponding to partially transmissive regions of the photomask. U.S. Pat. No. 5,976,968 discloses a method for making Dual Damascene profiles using a phase-shifting photomask in conjunction with a single photoresist process. A phase-shifting photomask is provided having opaque, semi-transmitting and transparent regions that is capable of selectively modulating the spatial distribution of electromagnetic radiation provided to a photoresist layer provided on top of a tri-layer insulating layer. In the disclosed methods, phase-shifting photomask is reported as useful for making Dual Damascene structures in the tri-layer insulating layer. The single photoresist processing strategies described in U.S. Pat. Nos. 6,355,399 and 5,976,968 lack processing flexibility, however, and also require a large photomask library for commercial implementation. For example, specific photomasks in the library are required for each trench and via geometry to be patterned and specific photomasks in the library are required for processing techniques using different resist materials and/or different resist thicknesses.

It will be appreciated from the foregoing that that there is currently a need for Dual Damacene processing methods capable of generating interconnect structures for high performance integrated electronics. Processing methods are needed that are capable of generating complex Dual Damascene profiles comprising networks of integrated trench and via structures. It will also be appreciated that a need exists for Dual Damascene processing methods using a single photoresist process and providing enhanced flexibility relative to conventional single resist Dual Damascene processing techniques.

SUMMARY OF THE INVENTION

This invention provides processing steps, methods and materials strategies for making patterns of structures for integrated electronic devices and systems. Processing methods of the present invention are capable of making micro- and nanoscale structures, such as Dual Damascene profiles, recessed features and interconnect structures, having non-uniform cross-sectional geometries useful for establishing electrical contact between device components of an electronic device. The present invention provides device fabrication methods and processing strategies using sub pixel-voting lithographic patterning of a single layer of photoresist useful for fabricating and integrating multilevel interconnect structures for high performance electronic or opto-electronic devices, particularly useful for Very Large Scale Integrated (VLSI) and Ultra large Scale Integrated (ULSI) devices. Processing methods of the present invention are complementary to conventional microfabrication and nanofabrication methods for making integrated electronics, and can be effectively integrated into existing photolithographic, etching, and thin film deposition patterning systems, processes and infrastructure.

Methods of the present invention provide a versatile fabrication platform for making a range of useful features (e.g., recessed features) and structures (e.g., interconnect structures) having non-uniform cross-sectional geometries that eliminate the need for complex, costly and time consuming multiple photoresist deposition, patterning and development processing steps. In an embodiment of this aspect, for example, the invention provides a process employing deposition, patterning and development of a single resist layer for making multilevel interconnect structures and networks of interconnect structures. Advantages provided by the present processing techniques include an overall reduction in the complexity and costs for making and integrating interconnect structures for multilevel integrated circuits and an enhancement in process throughput. The present methods are compatible with a range of patterned materials, including conducting materials such as aluminum, copper, chromium, nickel, platinum, titanium, tungsten, gold, tin, zinc and alloys thereof, dielectric materials, inorganic and organic semiconductors, and optically functional materials. In specific embodiments, methods of the present invention provide important processing steps for making high performance semiconductor devices, including microprocessors, microcontrollers, memory devices, application-specific integrated circuits and other Complementary metal-oxide-semiconductor (CMOS) and metal-oxide-semiconductor field-effect transistor (MOSFET) devices. The present methods also provide a fabrication platform for making a range of devices and systems other than electronic devices, including microelectromechanical and nanoelectromechanical systems, passive and active optical structures, opto-electronic devices and systems, and microfluidic and nanofluidic systems.

In an embodiment, the present invention provides a method of processing a substrate wherein partially overlapping exposure of radiation is used to generate one or more recessed features in a layer of radiation sensitive material, which are subsequently transferred to a substrate undergoing processing. In an embodiment, a layer of radiation sensitive material is provided on at least a portion of the substrate. A first area of the layer of radiation sensitive material is exposed to radiation having a first intensity. A second area of the layer of radiation sensitive material is exposed to radiation having a second intensity; wherein the second area of the layer at least partially overlaps the first area in an overlapping area. The layer of radiation sensitive material is developed by removing material from regions of the layer corresponding to (e.g., underneath) the first and second areas exposed to radiation, thereby generating a recessed feature having a first non-uniform depth profile in the layer of radiation sensitive material. At least a portion of the recessed feature, and optionally substantially all, having the first non-uniform depth profile in the layer of radiation sensitive material is subsequently transferred into the substrate; the transferring step generating a recessed feature having a second non-uniform depth profile in the substrate, thereby processing the substrate. Methods of this aspect of the present invention are useful for generating a recessed feature having a selected non-uniform cross-sectional geometry in a substrate. In a preferred embodiment, the steps of exposing first and second areas to radiation are carried out using sub-pixel voting lithography.

Optionally, the method of this aspect may further comprise the step of stripping the radiation sensitive material remaining after the step of transferring at least a portion of the recessed feature having the first non-uniform depth profile in the layer of radiation sensitive material into the substrate. In an embodiment of this aspect particularly attractive for high-throughput and low cost processing, a single layer of radiation sensitive material is deposited and patterned during processing in methods of the present invention.

In some methods of this aspect, the substrate is processed so as to make a recessed feature useful for the fabrication of interconnect structures for establishing electrical contact between inter-level and intra-level components of an electronic device. Methods of this aspect are particularly useful for fabricating a recessed feature comprising a Dual Damascene profile comprising an integrated trench and via structure useful for fabricating a multilevel device interconnect structure. In an embodiment useful for making Dual Damascene device interconnects, the recessed feature is transferred into a dielectric layer provided on a device substrate. As will be understood by those having skill in the art, however, the present invention includes processing methods that are also capable of generating a plurality of recessed features, for example a pattern of recessed features in the substrate. Recessed features generated by methods of this aspect of the present invention may have accurately selected relative spatial orientations and positions. This aspect of the present invention is useful for fabricating a network of recessed features spatially aligned with respect to each other for fabricating complex multilevel device interconnect configurations. Methods of this aspect of the present invention further comprise steps of exposing one or more additional areas of the radiation sensitive material to radiation prior to the developing and transferring processing steps. This aspect of the present invention is useful for making a plurality of recessed features in a substrate, for example a plurality of interconnected and/or separated trench and via structures, and for making recessed features having complex, multi-step depth profiles.

In methods of this aspect of the present invention, control over the cross-sectional profiles and relative spatial orientations of recessed features generated in the substrate is provided by controlling a number of important process parameters. Control of these process parameters is useful for accurately defining the physical dimensions and positions of recessed features fabricated by the present methods. First, selection of the areas, shapes and positions of first and second areas of the radiation sensitive material exposed to radiation controls, at least in part, the cross-sectional geometries, physical dimensions and positions of recessed features fabricated by the present methods. In particular, selection of the extent of overlap of first and second areas and the shape of the overlapping region provides a means of controlling the depth profile of the fabricated recessed feature. Second, selection of the intensities and spatial distribution of intensities of radiation provided to first and second areas of the radiation sensitive material, the net intensity provided to the overlapping area, and the thickness of the layer of radiation sensitive material provided to the substrate surface also provides a means of precisely controlling the cross-sectional dimensions (e.g., depth profile and aspect ratios) of recessed features fabricated by the present methods. Third, selection of the process conditions for transferring recessed features generated in the photoresist into the substrate (e.g., composition and thickness of the radiation sensitive layer, means for transferring the recessed feature in the radiation sensitive layer into the substrate etc.) is also useful for precisely controlling the cross-sectional dimensions (e.g., depth profile and aspect ratios) and three-dimensional shape of recessed features fabricated in the substrate or layer provided thereon.

In the present invention, at least one of the first area and the second area, and optionally both first and second areas, is exposed to a sub-threshold level of intensity of radiation so as to generate a recessed feature in the layer of radiation sensitive material having a non-uniform depth profile. In the context of this description, the expression "sub-threshold level of intensity of radiation" refers to an intensity of radiation provided to an area of the layer of radiation sensitive material that is less than the amount of radiation required to result in complete removal of photosensitive material along the entire thickness of the layer corresponding to areas exposed to radiation upon the developing step/processing. In an embodiment, the overlapping area is exposed to a cumulative intensity of radiation equal to the sum of the first and second intensities. The cumulative intensity provided to the overlapping area is a sub-threshold intensity in some embodiments, or alternatively may be an intensity large enough to result in completely removal of photosensitive material along the entire thickness of the layer corresponding to in the overlapping area upon the developing step/processing. In an embodiment, the cumulative intensity provided to the overlapping area is between 2 and 10 times larger than the first intensity and/or the second intensity.

In an embodiment, for example, the first and second intensities are large enough such that the overlapping area is exposed to the cumulative intensity of radiation large enough to provide complete removal of radiation sensitive material along the entire thickness of the layer corresponding to the overlapping area upon the developing step/processing, thereby opening up a portion of the substrate in the overlapping exposed region. In an embodiment, portions of the first area and second area do not overlap in one or more non-overlapping areas, and the first intensity, the second intensity or both are low enough such that the non-overlapping areas are exposed to intensities of radiation that provide only partial removal of radiation sensitive material along the thickness of the layer corresponding to the non-overlapping areas upon the developing step/processing.

In the present methods, selection of the physical dimensions and shapes of first and second areas of the layer of photosensitive material exposed to radiation and selection of the first and second intensities of radiation exposed to first and second areas, respectively, largely controls the physical dimensions and shape of the recessed feature(s) generated in the substrate. In some embodiments, the first area is selected from the range of 100 nanometers$^2$ and 500 microns$^2$, the second area is selected from the range of 100 nanometers$^2$ and 500 microns$^2$, and the physical dimensions of the overlapping area is selected from the range of 100 nanometers$^2$ and 100 microns$^2$. The extent of the overlap between first and second areas and the shape of the overlapping area are important process parameters in the present invention which define, at least in part, the cross sectional depth profiles of recessed features fabricated by the present methods. In an embodiment, the overlapping area is between 2 and 10 times smaller than the sum of the first area and the second area. In some methods of this aspect, between about 5% to about 100% of the first area of the layer of radiation sensitive material overlaps with the second area of the layer of radiation sensitive material, and/or between about 5% to about 100% of the second area of the layer of radiation sensitive material overlaps with the first area of the layer of radiation sensitive material. In an embodiment, the second area of the layer of radiation sensitive material overlaps completely the first area of the layer of radiation sensitive material, or the first area of the layer of radiation sensitive material overlaps completely the second area of the layer of radiation sensitive material.

In the present invention, the physical dimensions and shape of the recessed feature(s) generated in the layer of radiation sensitive material and the means of transferring the recessed feature from the layer into the substrate determines, at least in part, the physical dimensions and shape of the recessed feature(s) generated in the substrate. In an embodiment, the transferring step comprises removing material from the layer of radiation sensitive material and removing material from the substrate. In some methods, the transferring step comprises anisotropically etching a surface of the radiation sensitive material having the recessed feature. In these methods, the layer of radiation sensitive material functions, in part, as a mask, protecting the regions of the substrate that are not exposed by the recessed feature. However, the radiation sensitive material used in this process also undergoes anisotropic etching. In these methods, therefore, etching the layer of radiation sensitive material exposes regions of the substrate during transfer step processing which also undergo material removal via etching. Optionally, the transferring step comprises the step of simultaneously removing material from the radiation sensitive layer and the substrate. In an embodiment, for example, the transferring step is carried out by simultaneously etching the patterned layer of radiation sensitive material and regions of the substrate that are exposed by recessed features in the patterned layer. A range of processing techniques and process conditions may be used in the present for carrying out the transferring step, including, but not limited to, reactive ion etching, wet etching, dry etching, photoablation, ion milling, reactive ion beam etching (RIBE), chemically assisted reactive ion beam etching (CAIBE), and plasma etching (PE).

The non-uniform depth profile of the recessed feature(s) generated in the substrate may be the same or different than that of the recessed feature generated in the layer of radiation sensitive material. In an embodiment, for example, the maximum depth of the second non-uniform depth profile of the recessed feature generated in the substrate is 1 to 10 times that of the maximum depth of the first non-uniform depth profile of the recessed feature generate in the layer of radiation sensitive material. In an embodiment, the recessed feature in the layer of photosensitive material has depths selected from the range of 10 nanometers to 10 microns and the physical dimensions (e.g., length, width, etc.) selected from the range of 10 nanometers to 500 microns; and the recessed feature generated in the substrate has depths selected from the range of 10 nanometers to 10 microns and the physical dimensions (e.g., length, width, etc.) selected from the range of 10 nanometer to 500 microns.

The present invention includes methods wherein additional areas of the layer of radiation sensitive material are exposed to radiation. Additional areas exposed to radiation may be provided in an overlapping configuration, for example, so as to generate an additional recessed feature(s) in the substrate also having selected non-uniform depth profiles, such as additional integrated trench and via structures of Dual Damascene profiles. It is important to note that the intensities provided to the additional exposed areas in this embodiment are independently selectable with respect to the first and second intensities provided to first and second areas, respectively. Accordingly, the depths of the trenches can be different in different regions of the substrate. For example, in first location on the substrate the depth of the trench could be 100 nm and the depth of the via could be 400 nm, whereas in a second location on the substrate the depth of the trench could be 200 nm and the depth of the via could be 300 nm. The different depths can be obtained by selectively varying the exposure doses in selected overlapping and selected non-overlapping areas, so that the appropriate thickness of radiation sensitive material is left behind upon development.

In an embodiment of this aspect, the method of the present invention further comprises the steps of: (i) exposing a third area of the layer of radiation sensitive material to radiation having a third intensity, wherein the third area does not overlap the first area and the second area; and (ii) exposing a fourth area of the layer of radiation sensitive material to radiation having a fourth intensity; wherein the third area does not overlap the first area and second area, and wherein the fourth area of the layer at least partially overlaps the third area in an overlapping area. The developing step generates an additional recessed feature in the layer of radiation sensitive material, the additional recessed feature in the layer of radiation sensitive material having a third non-uniform depth profile; and wherein the transferring step generates an additional recessed feature in the substrate, the additional recessed feature in the substrate having a fourth non-uniform depth profile. In an embodiment of this aspect, the recessed feature having the second non-uniform depth profile is a first integrated trench and via structure in the substrate, and the additional recessed feature having the fourth non-uniform depth profile is a second integrated trench and via structure in the substrate, the first integrated trench and via structure having the same depth profile or having a different depth profile of that the second integrated trench and via structure. In an embodiment of this aspect, the third intensity does not equal the first intensity, the fourth intensity does not equal the second intensity or the third intensity does not equal the first intensity and the fourth intensity does not equal the second intensity.

Alternatively, additional areas exposed to radiation may be provide in a non-overlapping configuration, for example, so as to generate additional recessed features in the substrate having uniform depth profiles such as additional trench or via structures. In an embodiment, the method further comprises the step of exposing one or more additional areas of the layer of radiation sensitive material to radiation having a third intensity; wherein the one or more the additional areas of the layer do not overlap either the first area or the second area; wherein the developing step generates one or more additional recessed features having a first uniform depth profile in the layer of radiation sensitive material, wherein the transferring step generates one or more additional recessed features having a second uniform depth profile in the substrate. In some methods of this embodiment, the third intensity provided to additional areas is substantially equal to (within 10% of each other) the first intensity provided to the first area or the second intensity provided to the second area. In some methods of this embodiment, the third intensity provided to additional areas is substantially equal to (within 10% of each other) a cumulative intensity of radiation equal to the sum of the first and second intensities.

In another embodiment useful for making recessed features having a multi-step depth profile, three or more areas of the layer of radiation sensitive material are exposed to radiation, wherein the exposed areas overlap in a manner resulting in formation of a multi-step recessed feature in the layer that is subsequently transferred to the substrate. In this context, the expression "multi-step depth profile" refers to a depth profile having features corresponding to two or more stepped depth transitions. In an embodiment of this aspect, for example, the method further comprises the step of exposing one or more additional areas of the layer of radiation sensitive material to radiation having a selected intensity; wherein one or more of the additional areas of the layer overlap the first area, the second area or both of the first and second areas. Developing and transferring steps carried out after the exposure steps generate recessed features in the layer of radiation sensitive material and substrate having the same or different multi-step depth profiles. Methods of this aspect of the present invention are particularly attractive for generating complex multilevel interconnect structures.

In another aspect, the method of the present invention further comprises the step of depositing material onto the recessed feature in the substrate having the second non-uniform depth profile, thereby generating a structure at least partially embedded in the substrate. This aspect of the present invention is particularly useful for making interconnect structures having a selected non-uniform cross-sectional geometry that are at least partially embedded in a substrate or a dielectric layer provided on a substrate. The material deposited onto the recessed feature having the second non-uniform depth profile may be one or more materials selected from the group consisting of a conductor, a semiconductor and a dielectric material. In an embodiment, the structure comprises an electrical interconnect structure and the deposited material is one or more conductive materials. As will be understood by those having skill in the art, a variety of methods may be used in the present invention for carrying out the depositing step including, but not limited to, physical vapor deposition, chemical vapor deposition, ion beam sputtering deposition, plasma enhanced chemical thin film deposition, electron beam evaporation deposition, atomic layer deposition, and thermal evaporation deposition. In an embodiment of this aspect, the method further comprises the step of etching the material deposited onto the recessed feature, mechanically polishing the material deposited onto the recessed feature, and/or chemical mechanical polishing the material deposited onto the recessed feature or any combination of these, thereby generating the structure fully embedded in the substrate.

First and second areas of the layer of photosensitive material exposed to radiation may have the same or different physical dimensions (e.g., length, width, area) and/or shapes (e.g., rectangular, circular, ellipsoidal, square, triangular, or any combination of these shapes). In embodiments particularly useful for making interconnects for an electronic device, the first area has a shape corresponding to trench structures in a Dual Damascene profile, and the second area completely overlaps the first area and has a shape corresponding to via structures in a Dual Damascene profile. The positions of first and second areas of the layer of photosensitive material may be preselected and defined relative to each other so as to control the cross-sectional geometry of the structure fabricated by the present methods. In an embodiment, for example, the second area is smaller than, and entirely overlapping with, the first area, and is provide at a preselected position within the first area.

Radiation exposed to layers of radiation sensitive material may comprise electromagnetic radiation, including UV and/or visible electromagnetic radiation, and/or electrons, such as electrons provided by a beam of electrons, x-rays and/or ions, such as ions provided by a beam of ions. In the present methods, the first intensity exposed to the first area of the layer of radiation sensitive material and the second intensity exposed to the second area of the layer of radiation sensitive material may be substantially the same (e.g., within about 10%) or may be different. In some embodiments, the first intensity is provided uniformly across the first area, and the second intensity is provided uniformly across the second area, thereby resulting in uniform exposure of the overlapping area to radiation.

As will be understood by those having ordinary skill in the art, the steps of exposing the first area of the layer of radiation sensitive material to radiation having a first intensity and exposing the second area of the layer of radiation sensitive material to radiation having a second intensity can be carried via a number of techniques known in the art of lithographic processing. Useful exposure techniques for generating structures having physical dimensions selected with high accuracy and precision include, but are not limited to, sub pixel voting lithography, electron beam lithography, optical lithography, i-line lithography, deep ultraviolet light lithography, X-ray lithography, extreme UV lithography, ion beam lithography, optical maskless lithography using spatial light modulators and other next-generation lithography technologies. For some applications of the present invention, patterning of the layer of radiation sensitive material is carried out using one or more maskless lithography techniques, such as sub-pixel voting lithography. In an embodiment, for example, the steps of exposing the first area of the layer of radiation sensitive material to radiation having a first intensity and exposing the second area of the layer of radiation sensitive material to radiation having a second intensity is achieved using maskless lithography. Benefits provided by use of maskless lithography techniques, such as sub-pixel voting lithography, include that no physical alignment step is necessary between different exposure steps and exposure doses can be controlled with high precision, thereby resulting in lower net implementation costs and higher processing efficiency.

As will be understood by one having skill in the art, a variety of development processing steps and processing conditions are useful in the present invention, including contacting the layer of photosensitive materials with one or more developers (e.g., solvents), liquid phase development techniques, gas phase development techniques, etching development or combinations of these techniques. In an embodiment, the developing step comprises dissolving at least a portion of the layer of radiation sensitive material corresponding to the first and second areas exposed to radiation. In an embodiment, the radiation-sensitive material used during processing is a resist, for example a resist selected from the group consisting of: an electron-beam resist, a negative photoresist, and a positive photoresist. In some methods of the present invention, the thickness of the layer of radiation sensitive material is selected from the range of 100 nanometers to 500 microns.

Substrates useful in the present invention can be virtually any composition, including wafer substrates, thin film device substrates, flexible substrates, polymer substrates, ceramic substrates and glass substrates. The present methods are compatible with planar substrates and substrates having a contoured surface, such as convex and concave substrates. Substrates useful in the present methods include device substrates, for example, device substrates prepatterned with functional device components. In an embodiment, the substrate of the present invention comprises layer of dielectric material, such as a layer of low k dielectric, that is provided on a device substrate. In embodiments of this aspect, the present methods enable fabrication of interconnect structures embedded in the layer of dielectric material.

The present methods may be used to make a wide range of structures, including recessed features and structures embedded in a substrate or layer provided thereon. Structures fabricated by the present invention include device components, such as electrical interconnects, for integrated electronic circuits, thin film transistor devices, sensors, semiconductor devices, RF devices, photovoltaic devices, high power devices, memory devices, display devices and light emitting devices. Use of a deposition material comprising one or more electrical conductors, such as aluminum, copper, chromium, nickel, platinum, titanium, tungsten, gold, tin, and zinc is beneficial for methods of the present invention useful for making interconnect structures. Conductors may be deposited in discrete layers or deposited as a single unitary layer. The present invention optionally includes deposition of adhesion layers to enhance the mechanical adhesion of the structure to the substrate, and/or use of additional layers to enhance electrical contact of the structure to the substrate.

The present methods are useful for making a wide range of electronic devices and device arrays including, but not limited to, a transistor or array thereof, memory device, sensor, diode or array thereof, liquid crystal device, display device, optical source, microprocessor, microcontroller, a microfluidic system, a nanofluidic system, a nanoelectromechanical system, a microelectromechanical system, a wave guide, an optical system, an electro-optical system and interconnect structure. The present invention includes methods of establishing electrical contact between inter-level and/or intra-level device components of an integrated circuit. Methods of the present invention are particularly useful for making and integrating embedded interconnect structures, such as filled trench structures, filled via structures and filled integrated trench and via structures.

In another aspect, the present invention provides an electronic device component made by a method comprising the steps of: (i) providing a layer of radiation sensitive material on at least a portion of the substrate; (ii) exposing a first area of the layer of radiation sensitive material to radiation having a first intensity; (iii) exposing a second area of the layer of radiation sensitive material to radiation having a second intensity; wherein the second area of the layer at least partially overlaps the first area in an overlapping area; (iv) developing the layer of radiation sensitive material by removing material from regions of the layer corresponding to the first and second areas, thereby generating a recessed feature having a first non-uniform depth profile in the layer of radiation sensitive material; (v) transferring at least a portion of the recessed feature having the first non-uniform depth profile in the layer of radiation sensitive material into the substrate; the transferring step generating a recessed feature having a second non-uniform depth profile in the substrate; (vi) stripping the remaining radiation-sensitive material; and (vii) depositing material onto the recessed feature having the second non-uniform depth profile, thereby generating a structure at least partially embedded in the substrate. In an embodiment of this aspect, the deposited material is a conductor, such as a metal, and the electronic device component fabricated is electrical interconnect structure of an integrated circuit.

In another aspect, the present invention provides an electronic device made by a method comprising the steps of: (i) providing a layer of radiation sensitive material on at least a portion of the substrate; (ii) exposing a first area of the layer of radiation sensitive material to radiation having a first intensity; (iii) exposing a second area of the layer of radiation sensitive material to radiation having a second intensity; wherein the second area of the layer at least partially overlaps the first area in an overlapping area; (iv) developing the layer of radiation sensitive material by removing material from regions of the layer corresponding to the first and second areas, thereby generating a recessed feature having a first non-uniform depth profile in the layer of radiation sensitive material; (v) transferring at least a portion of the recessed feature having the first non-uniform depth profile in the layer of radiation sensitive material into the substrate; the transferring step generating a recessed feature having a second non-uniform depth profile in the substrate; (vi) stripping the remaining radiation-sensitive material; and (vii) depositing material onto the recessed feature having the second non-uniform depth profile, thereby generating a structure at least partially embedded in the substrate. In an embodiment of this aspect of the present invention, the electronic device is an integrated circuit and the at least partially embedded structure is an interconnect structure for establishing electrical contact between inter-level and intra-level device components.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

DETAILED DESCRIPTION OF THE INVENTION

Figure 1:
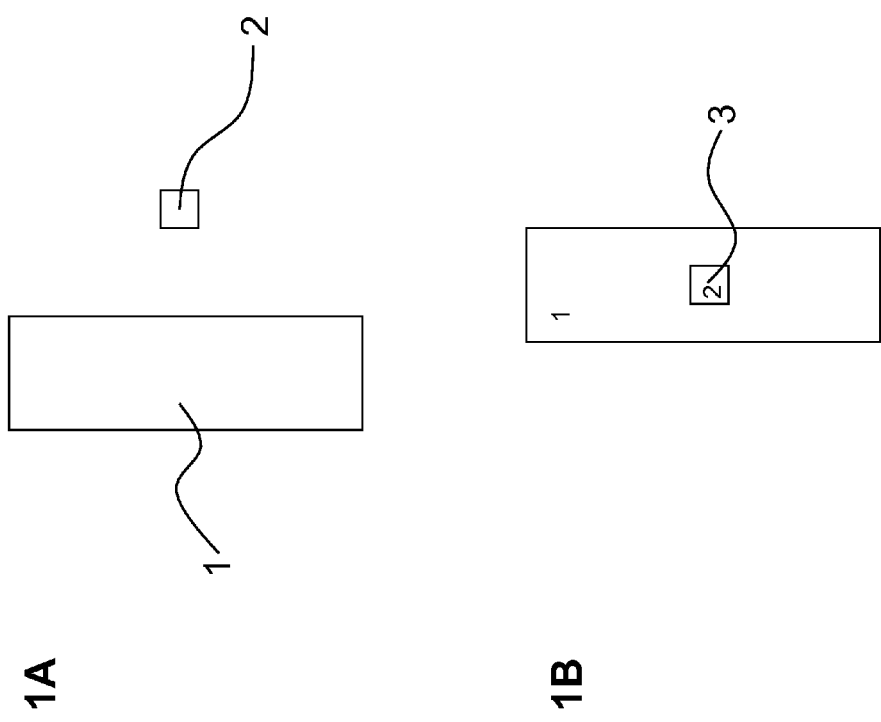
FIG. 1 illustrates the use of overlapping exposure of selected areas of a resist layer for making Dual Damascene integrated trench and via features and embedded multilevel interconnect structures.

Referring to the drawings, like numerals indicate like elements and the same number appearing in more than one drawing refers to the same element. In general the terms and phrases used herein have their art-recognized meaning, which can be found by reference to standard texts, journal references and contexts known to those skilled in the art. The following definitions are provided to clarify their specific use in the context of the invention.

"Intensity" refers to the time average energy flux of electromagnetic radiation, electrons or ions, for example the number of photons, electrons or ions per square centimeter per unit time, or the net number of photons, electrons or ions per square centimeter for a specified time interval. Intensity can be specific per unit area.

The expression "sub-threshold level of intensity of radiation" refers to an intensity of radiation provided to an area of the layer of radiation sensitive material that is less than the amount of radiation required to result in completely removal of photosensitive material in the exposed area along the entire thickness of the layer upon developing.

The expression "non-uniform depth profile" refers to the physical dimensions of recessed features of the present invention wherein the depth of the recessed features varies in one or two spatial dimensions (e.g. longitudinal and/or lateral dimensions such as length and width). In some embodiments, recessed features in a layer of radiation sensitive material having a non-uniform depth profile are generated in the present methods and subsequently transferred in to a substrate, or layer thereon, undergoing processing. In some embodiment, some portions of a recessed feature extend the entire thickness of the layer of radiation sensitive material and other portions of the recessed feature do not extend the entire thickness of the layer of radiation sensitive material. Recessed features having a non-uniform depth profile are useful in methods of the present invention for making structures having non-uniform cross-sectional geometries including, but not limited to, Dual Damascene profiles and device components such as, electrical interconnects and networks of electrical interconnects for integrated circuits.

"Transferring a recessed feature into a substrate" refers to a process wherein at least a portion of a recessed feature generated in a layer of radiation sensitive material is at least in part reproduced in a substrate undergoing processing, or layer provided thereon. In this context, transferring a recessed feature includes processes wherein the recessed feature generated in the substrate has substantially the same physical dimensions, such as depths and/or depth profiles, as that of the recessed feature in the layer of radiation sensitive material. Alternatively, transferring a recessed feature also refers to processes wherein recessed features the recessed feature transferred to the substrate has different physical dimensions, such as different depths and/or depth profiles, as that of the recessed feature in the layer of radiation sensitive material. In some embodiments, a recessed feature in a layer of radiation sensitive material is transferred to a substrate via processing wherein material is removed from the layer of radiation sensitive material and the substrate, optionally by processing wherein material is simultaneous removed from the layer of radiation sensitive material and the substrate for at least some portion of the transfer step. In some embodiments, a recessed feature is transferred from a layer of radiation sensitive material to a substrate by anisotropically etching the layer of radiation sensitive material and the substrate. In an embodiment, for example, an external surface of the layer of radiation sensitive material having the recessed feature is anisotropically etched so as to expose regions of the substrate positioned underneath the recessed feature. In these embodiments, regions of the substrate also undergo anisotropic etching as they are exposed by etching of the layer of radiation sensitive material having the recessed feature. As will be understood by those having skill in the art, the present invention includes a range of processing techniques for transferring a recessed feature in a layer of radiation sensitive material into a substrate including, but not limited to, reactive ion etching, wet etching, dry etching, photoablation, ion milling, reactive ion beam etching (RIBE), chemically assisted reactive ion beam etching (CAIBE), and plasma etching (PE).

The expression "non-uniform cross-sectional geometry" refers to a feature (e.g., recessed feature) or structure having a cross sectional dimension, such as thickness, that varies in one or two spatial dimensions (e.g. longitudinal and/or lateral dimensions such as length and width). Structures having a non-uniform cross-sectional geometry of the present invention include embedded structures wherein the thickness of the structure varies along the length and/or width of the structure and/or wherein the cross sectional profile of the structure is not uniform along the length and/or width of the structure. Structures having a non-uniform cross-sectional geometry of the present invention include, but are not limited to, interconnect structures for integrated circuits. Features of the present invention having non-uniform cross-sectional geometries include recessed features generated in substrates, such as Dual Damascene profiles and/or integrated trench and via structures.

In the following description, numerous specific details of the devices, device components and methods of the present invention are set forth in order to provide a thorough explanation of the precise nature of the invention. It will be apparent, however, to those of skill in the art that the invention can be practiced without these specific details.

The present invention provides methods for making recessed features having non-uniform cross-sectional geometries in substrates and methods for making embedded structures in substrates having non-uniform cross-sectional geometries. In some applications, the present methods are capable of making Dual Damascene profiles and interconnect structures using a single layer of radiation sensitive material, such as a single resist layer. In some methods, Sub-Pixel Voting (SPV) lithography is used to provide partial overlapping exposures of a layer of radiation sensitive material in order to generate recessed features in a substrate having non-uniform cross-sectional geometries.

The description that follows provides an explanation of embodiments of the present invention useful for making interconnect structures embedded in a substrate wherein the interconnect structure has a non-uniform cross-sectional geometry. The processes exemplified below include sub pixel voting lithography wherein exposure of selected overlapping areas of a layer of radiation sensitive material to sub-threshold intensities of radiation is used to generate recessed features having a non-uniform depth profile. It must be noted that the present methods can also extend to any other possible lithography exposure schemes, such as electron beam lithography (EBL), i-line lithography, deep ultraviolet lithography (DUV) etc.

For the purpose of this description, we assume that a 100% dose of radiation is required for complete removal upon development of a region of the layer of radiation sensitive material corresponding to an exposed area (i.e., removal of all material extending along the entire thickness of the layer corresponding to the area exposed to radiation). Accordingly, a dose of less than 100% refers to a dose of radiation that results in incomplete removal upon developing of the layer of photosensitive material corresponding to the exposed area (i.e., development results in not a complete removal of material extending along the entire along the entire thickness of the layer corresponding to the area exposed to radiation). For the sake of clarity, the convention "XXX % dose" refers to a dose of radiation referenced relative to the 100% dose, thus a 50% dose is 50% of a 100% dose, a 20% dose is 20% of a 100% dose and so forth. In the context of this description, the layer of radiation sensitive material may be referred to, and/or exemplified as, a "photoresist", a "resist", a "positive resist", a negative resist and layers thereof.

In an embodiment, a layer of resist is first applied to a receiving surface of the substrate that is subject to processing. Optionally, the layer of resist is baked prior to exposure to radiation to provide enhanced mechanical stability. Selected areas of the resist layer are subsequently exposed to radiation, for example, using one or more of the exposure methods referenced above. In the case of EBL, for example, a rectangle of selected dimensions (e.g., length and width) is patterned into the resist layer by exposure to a selected intensity of electrons. In an embodiment, for example, the rectangle is patterned by EBL writing using a sub-threshold intensity of electrons, for example using a 50% dose of radiation. Once the rectangle is patterned, a square is pattern via EBL using a sub-threshold intensity of electrons, for example a 50% dose of radiation. In an embodiment useful for making an integrated trench and via recessed feature, the square is patterned in such a way that it completely overlaps the first rectangle patterned into the resist layer provided on the substrate. The portion of the rectangle pattern that overlaps the square pattern receives a larger dose of radiation that the non-overlapping area of the rectangle pattern. Therefore, a greater extent of the thickness of the resist layer corresponding to the overlapping area is removed upon development than in areas corresponding to the non-overlapping area of the rectangle.

In the present specific example, the overlapping area receives a 100% dose, and thus the entire thickness of the resist layer corresponding to the overlapping area is removed upon development. In contrast, the area of patterned rectangle that does not overlap the patterned square receives only a 50% dose of radiation, and therefore undergoes incomplete material removal upon developing. Once the sample is developed, therefore, portions of the resist that received the 100% dose of radiation are entirely removed. In contrast, areas of the resist that received the 50% dose of radiation are incompletely removed. For example, the nonoverlaping areas of the patterned rectangle may be removed to half the thickness of the resist layer, or in some embodiments may be removed to more than half of the thickness of the original resist layer (but less than the entire thickness) or less than half of the thickness of the original resist layer depending on the contrast of the developer and on the properties of the resist itself. In the present invention, the contrast of the developer can be controlled both chemically and thermally. Accordingly, developing results in formation of a recessed feature in the resist layer having a non-uniform depth profile. In this example, the rectangle pattern of the recessed feature corresponds to the trench structure to be transferred to the substrate and the square pattern of the recessed feature corresponds to the via structure to be transferred to the substrate. Although doses of 50% (non-overlapping areas) and 100% (overlapping areas) are exemplified in this description, any combination of doses can be employed in the present methods having at least one sub-threshold dose patterned into the resist layer.

After developing, the recessed feature in the resist layer is transferred into the substrate. In an embodiment, this transfer process is achieved using anisotropic etching, for example using reactive ion etching. In the transfer processing step, the resist layer functions, in part, as an etch mask, by masking the regions of the substrate that are not exposed (e.g., opened up) upon formation of the recessed feature in the resist layer. Exposed regions of the substrate not covered by patterned resist layer are subject to etching upon this process step. It is important to note, however, that the resist does not function as a perfect etch mask, as it also undergoes etching, optionally at a slow rate. This property of the patterned resist layer is exploited in the present transfer processing step, as transfer processing of some embodiments makes use of simultaneous material removal of the resist layer and the substrate. As the etching process is carried out, for example, the area of the resist that received only a 50% dose of radiation is etched and at some point is completely removed, thereby exposing additional regions of the underlying substrate to the etchant. Accordingly, upon complete removal of the regions of the photoresist corresponding to areas exposed to the 50% dose of radiation, etching is initiated in the newly exposed areas of the substrate. At some stage the T-shaped depth profile in the resist is transferred to the underlying substrate, for example transferred to a layer of dielectric material provided on a device substrate. After etching is completed, a vertical cross section of the substrate has a dual Damascene profile. Optionally, the resist layer remaining after the transfer process is removed, for example via stripping. To fabricate an interconnect structure, a high conductivity metal such as copper is deposited over the entire wafer so as to fill the recessed feature transferred to the substrate. After the trenches and the vias are filled with metal, excess metal is removed, for example using a chemical mechanical polishing (CMP) processing step.

In some embodiments, patterning is carried out using sub pixel voting lithography techniques implemented with a maskless system using a spatial light modulator (SLM). For example, the rectangle can be patterned with a selected dose (e.g., 50% dose) by turning 'on' the required pixels and the square feature can also be patterned with a selected dose (e.g., 50% dose) by turning 'on' the required pixels.

As will be evident to those having skill in the art, doses of radiation other than a 50% dose can readily used in the present invention, including various combinations of doses exposed to first and second areas (e.g., rectangle and square areas) and additional areas, including but not limited to various combinations of 5%, 10%, 15%, 20%, 25%, 30%, 35%, 40%, 45%, 50%, 55%, 60%, 65%, 70%, 75%, 80%, 85%, 90%, 95% and 100%. An important requirement for some processing methods, however, is that the non-overlapping area is exposed to a sub-threshold intensity (e.g., dose less than 100%). In some embodiments, the resist material is selected to provide a certain depth of the recessed feature in the resist for a certain exposure, for example a 50% dose need not mean that it lowers the height in the resist by 50% after development; it could have lowered the height of the resist by 90%.

An advantage of the present invention is that it makes use of a single layer of resist. This advantage not only reduces the complexity in making the above mentioned profiles but also significantly reduces the costs associated with purchasing additional resists and developers for the resists. The present methods also improve throughput because both trenches and vias are etched in the same step. The present methods are particularly attractive for Dual Damascene processing because not only are the trenches and vias simultaneously deposited with metal but they are also simultaneously etched.

Specific embodiments of the present invention are further described and set forth by reference to the Figures.

Figure 2:
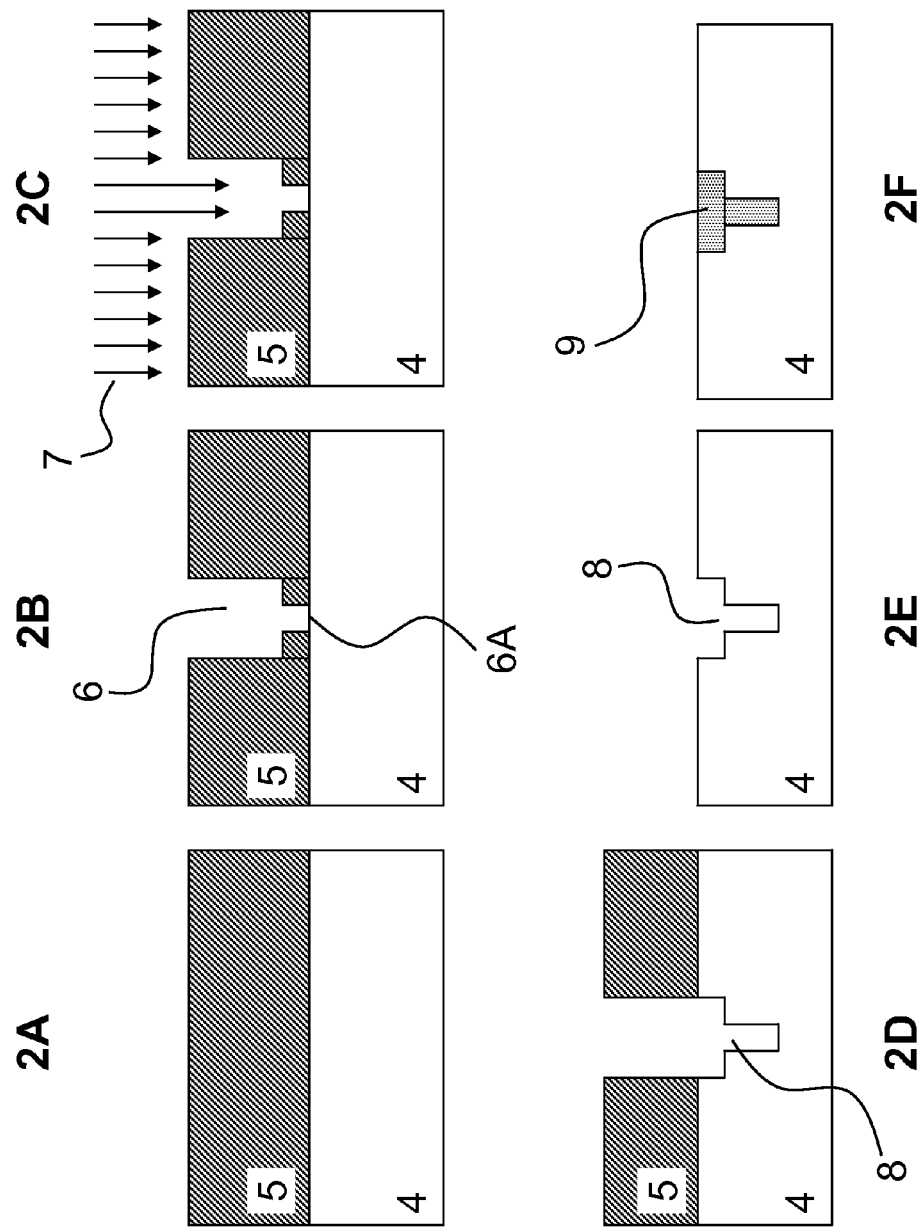
FIG. 2 provides a schematic illustrating additional processing steps of methods of the present invention, including development, transfer, stripping and deposition steps.

FIG. 1 illustrates the use of overlapping exposure of selected areas of a resist layer for making Dual Damascene integrated trench and via features and embedded multilevel interconnect structures. The exposure areas exemplified in FIGS. 1A and 1B correspond to areas of a resist layer provided on a substrate undergoing processing that are exposed to radiation (as shown in FIG. 2). FIG. 1A illustrates the dimensions and shape of a first area of the resist layer exposed to a selected intensity of radiation comprising rectangle 1, and the dimensions and shape of a second area of the resist layer exposed to radiation comprising square 2. FIG. 1B shows the spatial arrangement of rectangle 1 and square 2 useful for making recessed features and embedded structures having a non-uniform cross sectional profile. As shown in FIG. 1B, the exposed first and second areas are positioned so as to provide overlap between rectangle 1 and square 2. Specifically, square 2 is positioned such that it entirely overlaps rectangle 1, as shown in FIG. 1B. This overlap configuration is particularly useful for making a recessed feature in the substrate corresponding to a Dual Damascene profile comprising integrated trench and via features.

In a specific embodiment, rectangle 1 and square 2 are both patterned in the resist layer using a 50% dose of radiation, and are positioned to overlap in the manner shown in FIG. 1B. Although a 50% does is exemplified, any sub-threshold dose is useable in this specific embodiment of the present invention. Overlapping region 3 corresponds to the entire area square 2, as shown in FIG. 1B, and as a result of the overlap of rectangle 1 and square 2, overlapping region 3 is exposed to a cumulative intensity of radiation corresponding to a 100% dose radiation. Once lithographic patterning via exposure of rectangle 1 and square 2 to selected intensities of radiation is completed, the patterned resist layer is subsequently developed so as to generate a recessed feature in the layer of resist having a non-uniform depth profile (See, e.g., FIG. 2).

FIG. 2 provides a schematic illustrating additional processing steps of methods of the present invention, including development, transfer, stripping and deposition steps. FIG. 2A provides a cross sectional view of the resist layer 5 provided on the substrate 4 undergoing processing. As discussed in the context of FIG. 1, resist layer 5 is lithographically patterned using overlapping exposure of rectangle 1 and square 2. FIG. 2B shows a cross sectional view the resist layer 5 and substrate 4 upon developing the patterned resist layer 5. As shown in FIG. 2B, developing removes material from the patterned resist layer 5 in first and second areas exposed to radiation. Development may be carried out by any means known in the art including via dissolution using developers and developing agents.

As shown in FIG. 2B, the non-overlapping area of the first exposed area corresponding rectangle 1 that received a net 50% dose of radiation is reduced to a half or lower than half of the original thickness due to incomplete removal of resist during developing. In contrast, the overlapping area 3, corresponding to square 2 provided in an entirely overlapping configuration, undergoes complete development and, hence, resist is completely removed along the entire thickness of the resist layer 5 in a region corresponding to the overlapping area. As a result of development, therefore, a region 6a of the substrate 4 is exposed corresponding to the overlapping area of patterned first and second areas. The result of developing, as shown in FIG. 2B, is generation of a recessed feature 6 in the resist layer 5 having a non-uniform, T-shaped depth profile.

FIGS. 2C and 2D schematically illustrates a transfer process of the present invention wherein recessed feature 6 in the resist layer 5 is transferred to substrate 4. In the embodiment shown in this Figure, patterned resist layer 4 and exposed regions of the substrate 4 are simultaneously anisotropically etched (schematically represented by arrows 7). In a specific embodiment, for example, anisotropic etching is carried out using by RIE. As shown in FIG. 2C, resist layer 5 having recessed feature 6 functions, in part, as an etch mask, initially allowing etching of the substrate only in the region 6a exposed by the recessed feature in the resist layer. The composition of resist layer 5 is selected, however, such that it also undergoes etching. Therefore, at some point during the transfer process, etching of resist layer 5 exposes additional regions of the substrate corresponding to the nonoverlaping area of rectangle 1 which received the 50% dose during lithographic patterning. Upon exposure, these newly exposed regions of the substrate 4 also are subjected to anisotropic etching, thereby generating a recessed feature 8 in substrate 4 having a T-shaped, non-uniform depth profile.

As illustrated by FIG. 2D, upon completion of the anisotropic etch processing, the T-shaped profile 6 in resist layer 5 is now transferred to the substrate 4. This transfer process generates recessed feature 8 in substrate 4 having a non-uniform depth profile. It is important to note that the physical dimensions of recessed feature 6 in resist layer 5 and recessed feature 8 in substrate 4 can differ depending on differences in the etch rates of the resist 5 and the substrate 4. In some embodiments, for example, the depth profiles, aspect ratios and/or maximum depths of recessed feature 6 in resist layer 4 differ from those of recessed feature 8 in substrate 4. In the process exemplified by FIGS. 1 and 2, recessed feature 8 in substrate 4 has a non-uniform depth profile corresponding to a Dual Damascene profile with integrated trench and via features.

After transfer processing, the remaining resist layer 5 is subsequently removed, for example via stripping. The result of this stripping step is schematically illustrated in FIG. 2E, showing substrate 4 having recessed feature 8 without a resist layer 5. In applications for making device interconnect structures, a high conductivity metal, such as copper or silver, is deposited on the surface of the substrate having recessed feature 8. The present invention also includes, however, the use of one or more deposited adhesion layers to enhance deposition of metal onto the recessed feature 8. This deposition processing step results in filling the recessed feature 8 with the high conductivity metal, thereby making a structure 9 at least partially embedded in substrate 4, as shown in FIG. 2F. Optionally, excess metal, such as metal provided to surfaces of the substrate other than the recessed feature, is removed, for example via CMP. The result of this processing sequence is fabrication of embedded structure 9, comprising an interconnect structure, such as an integrated filled trench and filled via structure.

It should be noted that when optical lithography is used to make trenches and vias, the underlying metal layers are commonly coated with anti reflection coatings (ARC). The schematics here do not illustrate any ARCs for the sake of simplicity.

Figure 3:
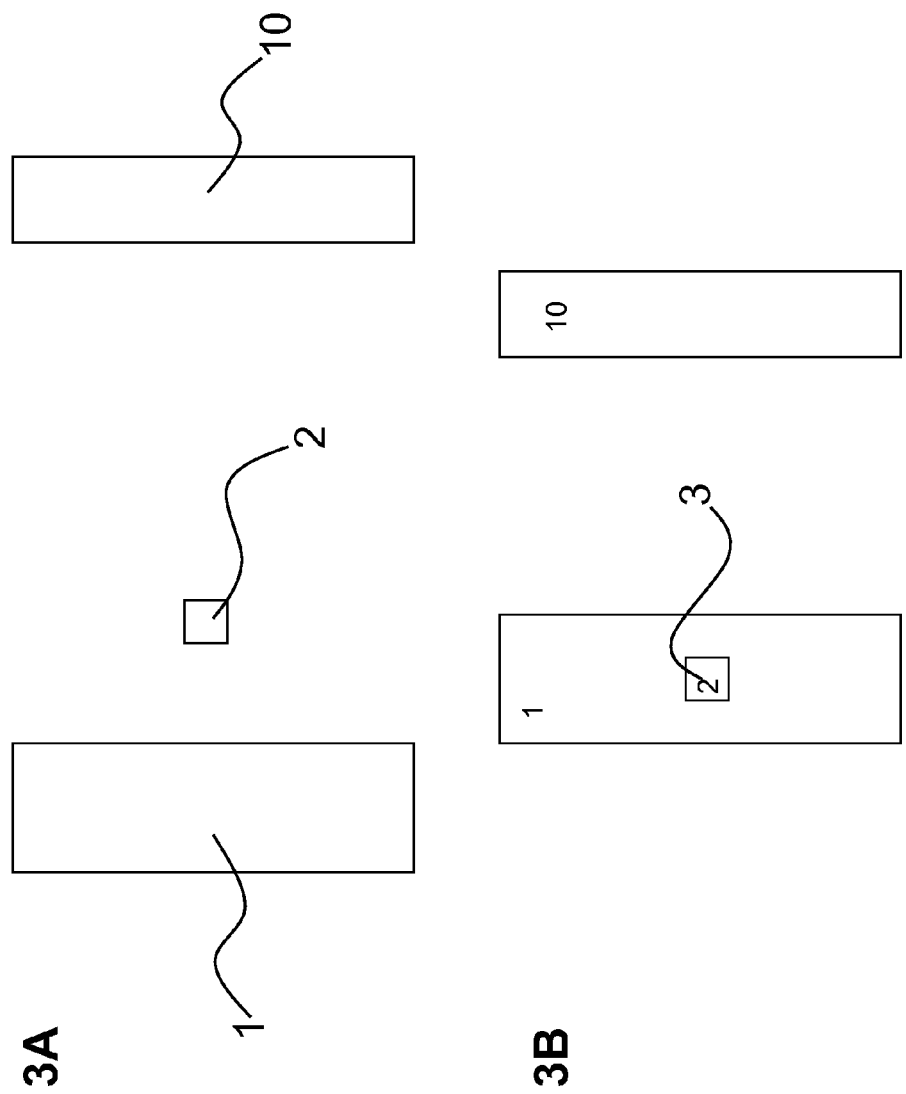
FIG. 3 shows a CAD layout design of exposure areas useful for fabricating a Dual Damascene profile in combination with a trench feature in a substrate, for example in a layer of dielectric material provided on a device substrate.

FIG. 3 shows a CAD layout design of exposure areas useful for fabricating a Dual Damascene profile in combination with a trench feature. FIG. 3A illustrates the dimensions and shape of a first area of the resist layer exposed to a selected intensity of radiation comprising rectangle 1, the dimensions and shape of a second area of the resist layer exposed to radiation comprising square 2, and the dimension and shape of a third area of the resist layer exposed to radiation comprising rectangle 10. FIG. 3B shows the spatial arrangement of rectangle 1, square 2 and rectangle 10 useful for making spatially aligned Dual Damascene profile and trench features. As shown in FIG. 3B, during exposure to radiation rectangle 1 and square 2 are positioned to overlap (similar to the configuration shown in FIG. 1B), and rectangle 10 is positioned so as not to overlap either rectangle 1 and square 2. In a specific embodiment, rectangle 1 and square 2 are both patterned with a 50% dose of radiation and the third area comprising rectangle 10 is patterned with 100% dose of radiation. These exposure intensities are useful for generating a trench feature that extends substantially the same (e.g., within 10%) depth as the via feature in the Dual Damascene profile. Alternatively, rectangle 1 and square 2 are both patterned with a 50% dose and the third area comprising rectangle 10 is patterned with 50% dose, so as to generate a trench feature that extends substantially the same (e.g., within 10%) depth as the trench feature in the Dual Damascene profile (See, e.g., FIG. 5).

Figure 4:
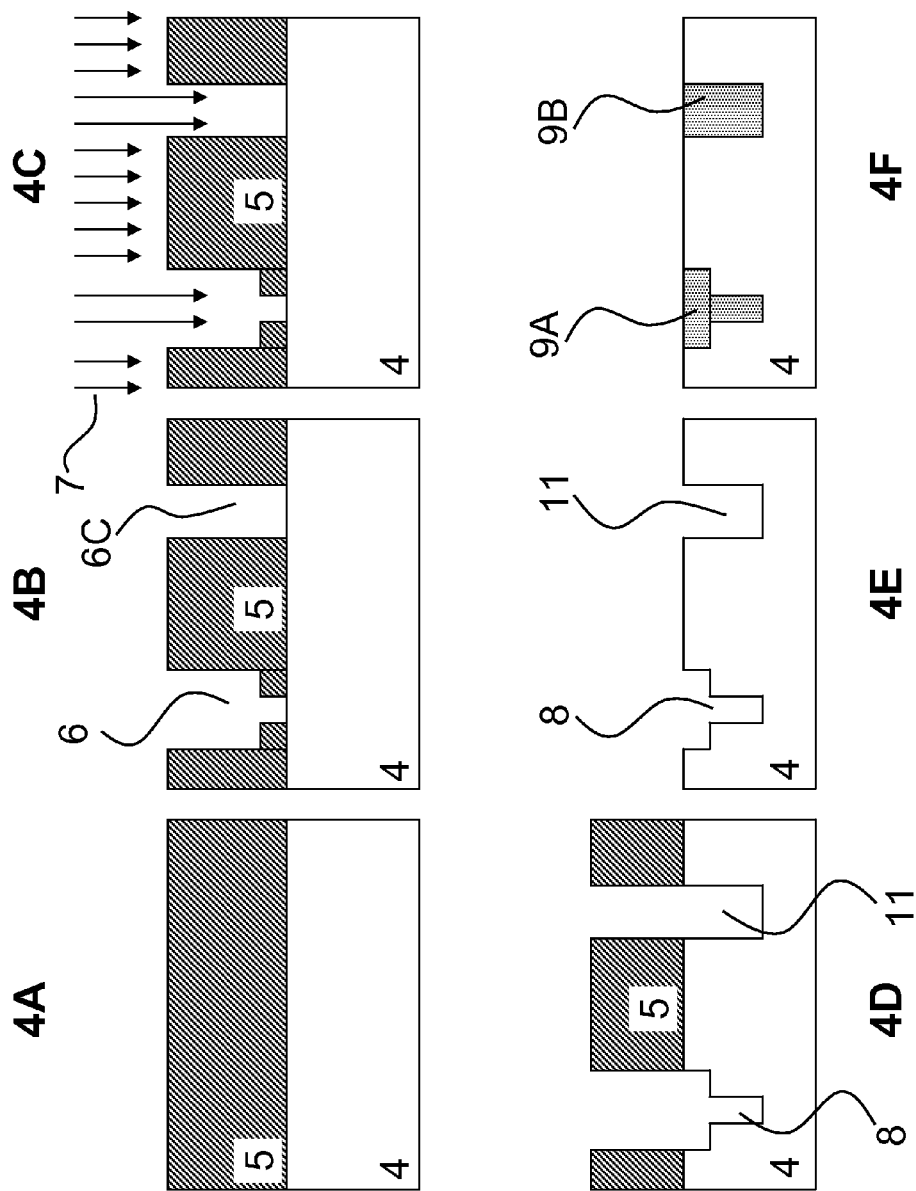
FIG. 4 provides a schematic illustration of processing steps for making a spatially aligned Dual Damascene profile and trench in the same substrate or layer provided thereon.

FIG. 4 provides a schematic illustration of processing steps for making spatially aligned Dual Damascene profile 8 and trench 11 using the exposure configuration shown in FIG. 3B. Similar to the process flow schematic shown in FIG. 2, the process combines exposure, development, transfer, stripping and deposition steps. As shown in FIG. 4A, resist layer 5 is provided on substrate 4 and subsequently patterned via exposure to radiation of first, second and third areas schematically illustrated in FIG. 3B. As shown in FIG. 4B, development of the exposed resist layer results in formation of two spatially aligned recessed features: (i) a first recessed feature 6 having a T-shaped, non-uniform depth profile, and (ii) a second recessed feature 6c having a uniform depth profile.

As shown in FIG. 4C, the spatially aligned recessed features in the resist layer are subsequently transferred into the substrate, for example using anisotropic etching (as schematically illustrated by arrows 7). This transfer process is carried out in a manner similar to that described in the context of FIG. 2C, and results in formation of Dual Damascene profile 8 comprising integrated trench and via features and trench feature 11. As shown in FIGS. 4D and 4E, trench feature 11 extends a depth into substrate 4 substantially equal to (within 10%) the depth of the via feature of Dual Damascene profile 8. The remaining resist layer 5 is removed, for example, via stripping, thereby generating substrate 4 having the spatially aligned Dual Damascene profile 8 and trench feature 11 without resist layer 5. To generate a network of interconnect structures, a deposition step is used to, optionally simultaneously, fill Dual Damascene profile 8 and trench 11. As described in the context of FIG. 2, optionally, the excess metal provided to surfaces of the substrate other than the recessed features is removed, for example via CMP processing. As shown in FIG. 4F, the deposition processing step results in a network of interconnect structures comprising a filled integrated trench and via 9A and a filled trench 9B. A benefit of this processing method of the present invention is that a network of interconnect structures are fabricated with preselected spatial positions and orientations with respect to each other.

Figure 5:
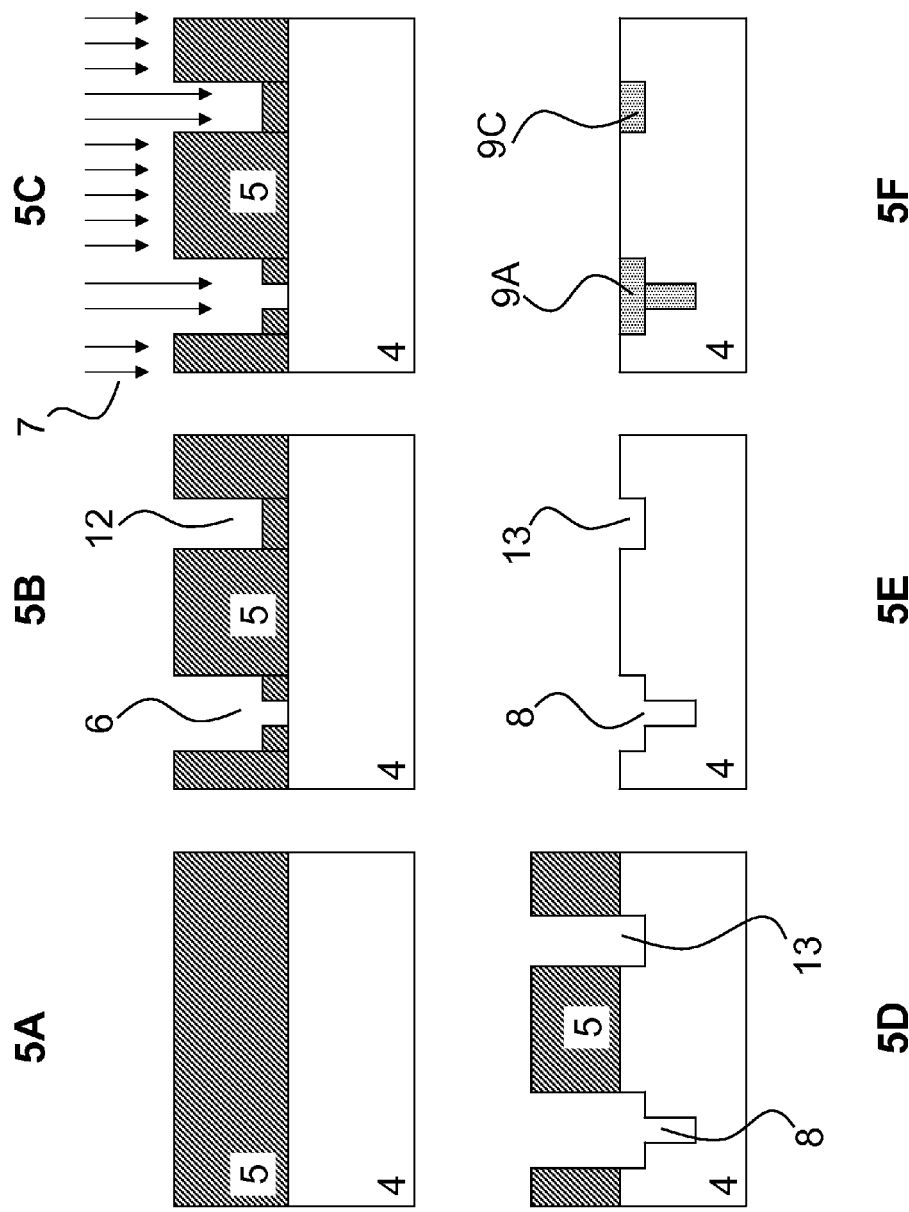
FIG. 5 provides another process flow schematic showing processing steps for making a network of interconnect structures comprising a spatially aligned Dual Damascene profile and trench feature in the same substrate or layer provided thereon.

FIG. 5 provides another process flow schematic showing processing steps for making a network of interconnect structures comprising a spatially aligned Dual Damascene profile 8 and trench feature 13. As shown in FIG. 5, the Dual Damascene profile 8 comprises integrated trench and via features, and trench feature 13 extends a depth into substrate 4 substantially equal to (within 10%) the depth of the via feature of Dual Damascene profile 8. This interconnect configuration is achieved by patterning the trench 13 with a 50% dose of radiation, and patterning the Damascene profile 8 as described above in the context of FIGS. 1-4. As described in the context of FIGS. 2C and 4C, recessed features in the resist layer 5 are transferred into the substrate 4, for example using anisotropic etching, thereby generating Dual Damascene profile 8 and trench 13. As shown in FIGS. 5D and 5E, the depth of trench 13 is substantially the same as the depth of the trench feature in the Dual Damascene profile 8. As discussed in the context of FIGS. 2F, 4F, and 5F, trench 13 and Dual Damascene profile 8 can subsequently be filled with one or more metals and processed via CMP to generate an embedded network of interconnect structures. As shown in FIG. 5F, the deposition processing step results in a network of interconnect structures comprising a filled integrated trench and via 9A and a filled trench 9C. In combination, FIGS. 4 and 5 illustrate the versatility of the present method wherein the physical dimensions, shapes, depths and depth profiles, and/or cross-sectional geometries of recessed features and interconnect structures are accurately and independently controllable via selection of the exposure conditions, resist composition and thickness, substrate composition and process conditions for transfer of recessed features into the substrate.

Figure 6:
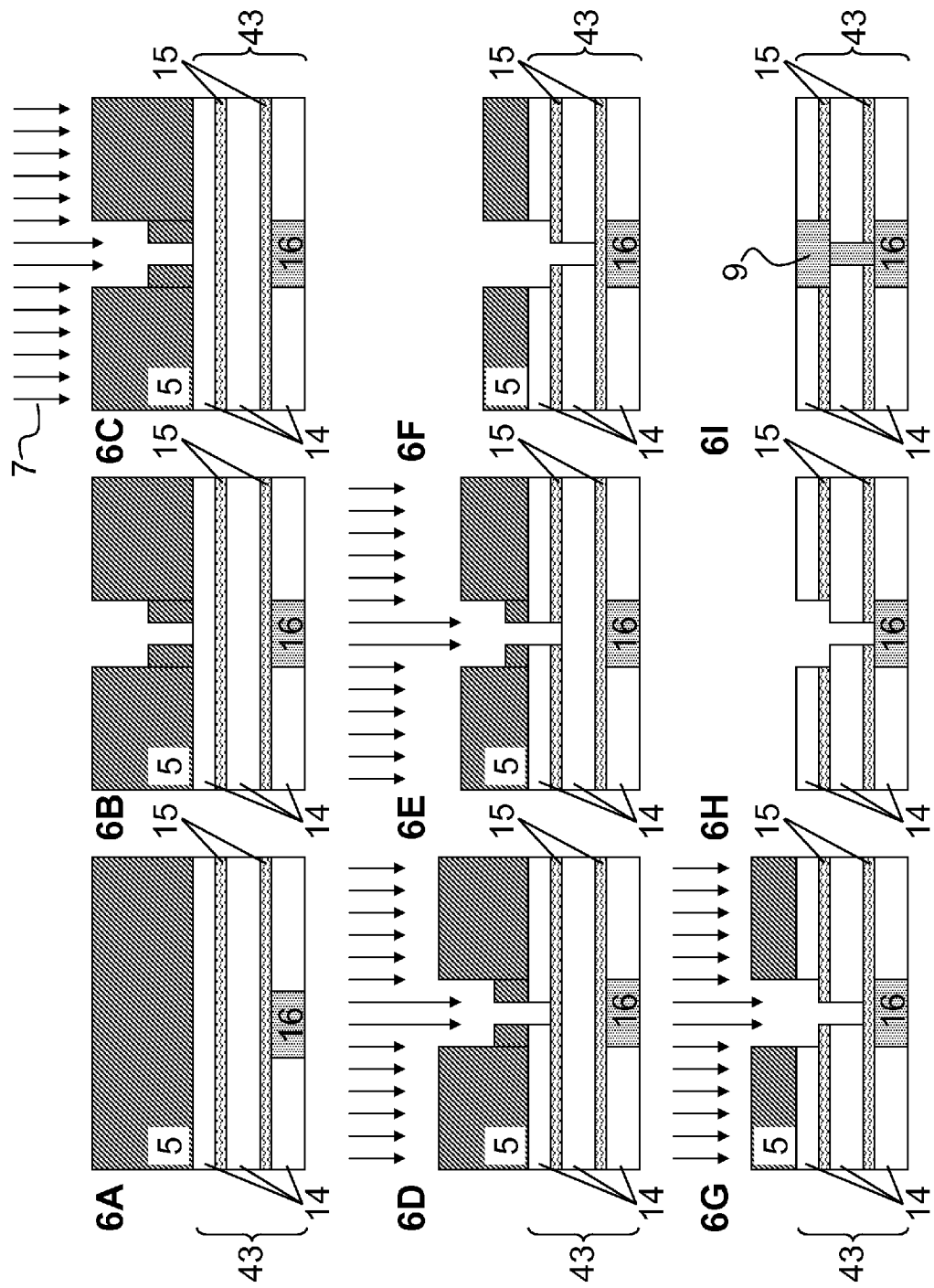
FIG. 6 provides a process flow schematic illustrating the processing steps involved in making a Dual Damascene profile in a dielectric stack, for example, a dielectric stack provided on a device substrate.

FIG. 6 provides a process flow schematic illustrating the processing steps involved in making a Dual Damascene profile in a dielectric stack, for example, a dielectric stack provided on a device substrate. In an embodiment, dielectric stack 43 comprises a plurality of layers of low k dielectric material 14 and etch stop layers 15. In the dielectric stack configuration shown in FIG. 6A, the etch stop layers 15 are provided between layers of low k dielectric material 14. In this method, a recessed feature having a non-uniform, T-shaped depth profile is formed in a resist layer provided on the dielectric stack using the partially overlapping exposure configuration illustrated in FIG. 1B. As shown in FIG. 6B, the T-shaped depth profile in the resist layer 5 exposes an exposed region of the first layer of low k dielectric material 14 in the dielectric stack 43. As shown in FIGS. 6C-6G, the recessed feature in the resist layer 5 is transferred into the dielectric stack 43 via simultaneously anisotropically etching (schematically shown as arrows 7) the resist and the dielectric stack 43, for example using RIE.

In the transfer process, the resist layer first functions as an etch mask in the processing step shown in FIGS. 6C and 6D, providing selective etching of the region of the first layer of low k dielectric material 14 exposed by the recessed feature in the resist layer. As shown in FIG. 6E, after the first layer of dielectric is completely etched, the first etch stop layer is etched, for example using a different etchant (e.g., different etchant gas) or different RF power. As demonstrated by a comparison of FIGS. 6C and 6D, the resist layer 5 has a composition such that it is also susceptible to etching and, therefore, the thickness of the resist layer is lowered during etching of the first low k dielectric layer. As shown in FIG. 6F, continued processing by etching of the resist layer and dielectric stack 43 results in formation of the trench structure in the first layer of low k dielectric, while at the same time forming a via in the second layer of dielectric. In some embodiments, an embedded filled trench structure 16 is provided in a third low k dielectric layer. Removing the etch stop layer above the trench 16, for example by etching, is useful for generating a filled via structure capable of electrically connect the two trenches. Upon completion of the transfer of the recessed feature in the resist into the dielectric stack 43, subsequent deposition processing and CMP processing resulting in fabrication of a filled integrated trench and via structure embedded in the dielectric stack 43.

Figure 7:
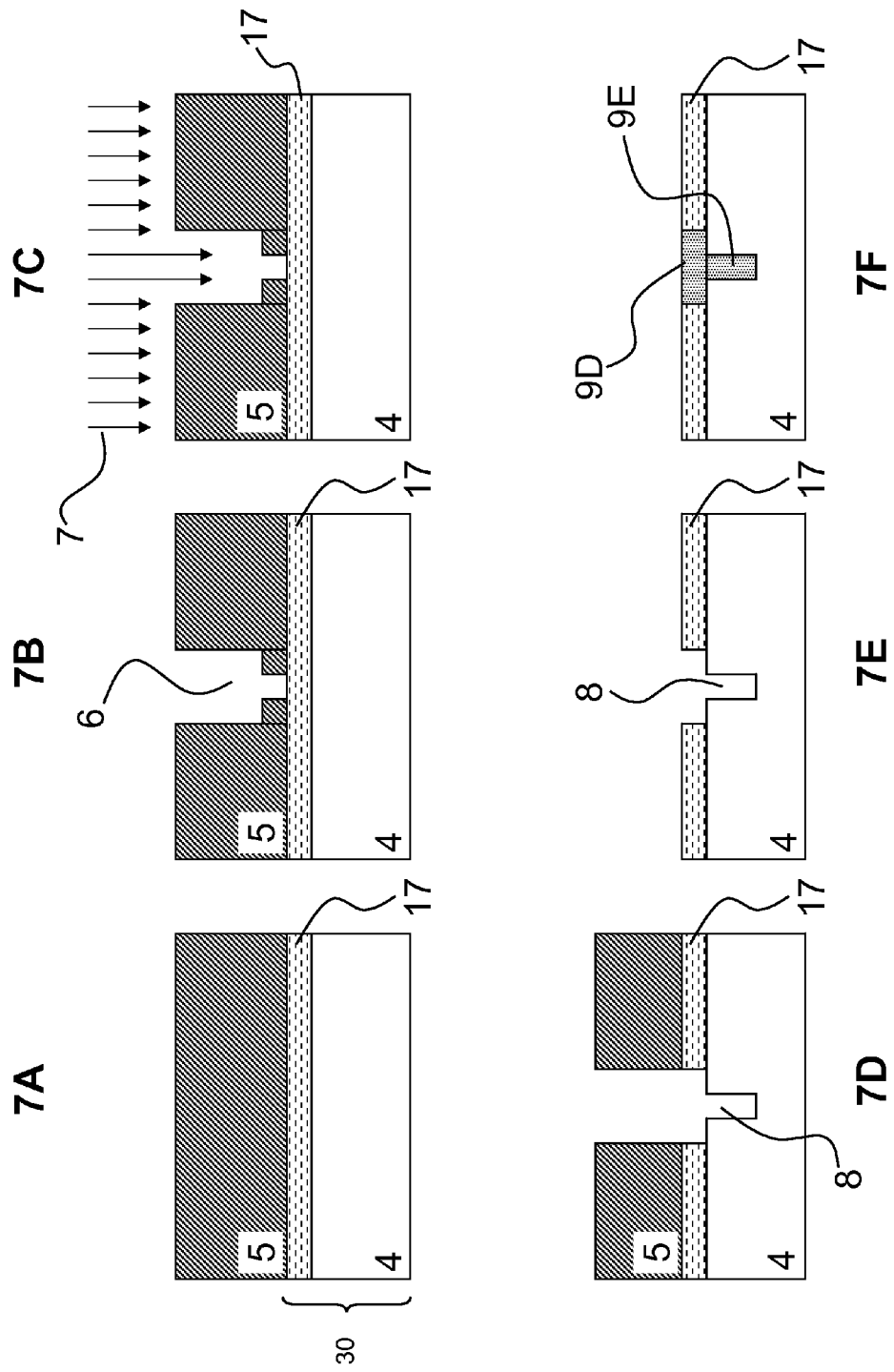
FIG. 7 provides a process flow schematic showing processing steps for making a Dual Damascene profile in a dielectric stack wherein trench and via features are provided in different dielectric layers.

FIG. 7 provides a process flow schematic diagram showing processing steps for making a Dual Damascene profile in a dielectric stack wherein trench and via features are provided in different dielectric layers. As shown in FIG. 7A, dielectric stack 30 comprises a first dielectric layer 17 and a second dielectric layer 4. As shown in FIGS. 7A-7F, process conditions in this method of the present invention are selected such that the trench feature and the via feature are generated in different dielectric layers of the dielectric stack 30. The trench is generated in dielectric layer 17, while the via is generated in dielectric layer 4. In some embodiments, the height of the resist in the T-shaped profile 6 is precisely controlled in order to etch the right depth into the first layer of dielectric. As shown in FIG. 7F, the filled trench structure 9D of the interconnect is provided in dielectric layer 17 and the filled via structure 9E is provided in dielectric layer 4.

Figure 8:
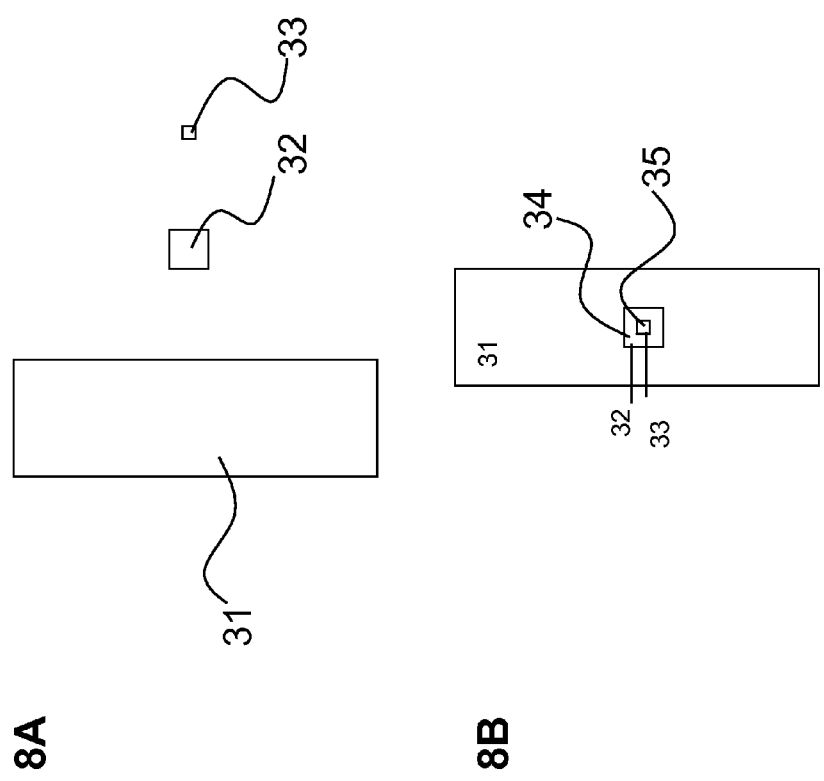
FIG. 8 illustrates the use of overlapping exposure of selected areas of a resist layer for making a Dual Damascene profile and an embedded multilevel interconnect structure having a multi-step cross sectional geometry.
Figure 9:
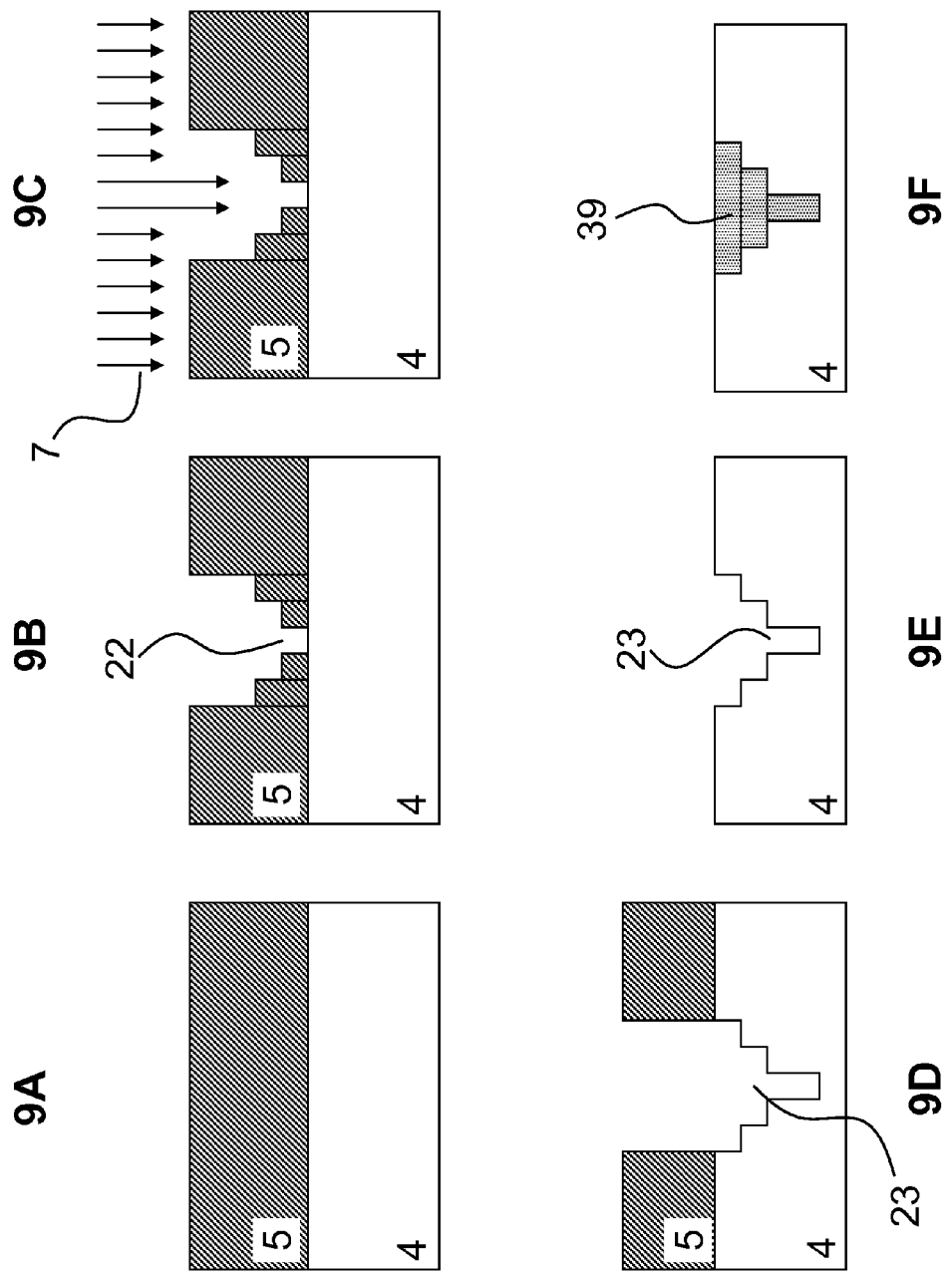
FIG. 9 provides a schematic illustrating additional processing steps of methods of the present invention for making a Dual Damascene profile and an embedded multilevel interconnect structure having a multi-step cross sectional geometry, including development, transfer, stripping and deposition steps.

FIG. 8 illustrates the use of overlapping exposure of selected areas of a resist layer for making a Dual Damascene profile and an embedded multilevel interconnect structure having a multi-step cross sectional geometry. The exposure areas exemplified in FIGS. 8A and 8B correspond to areas of a resist layer provided on a substrate undergoing processing that are exposed to radiation (as shown in FIG. 9). FIG. 8A illustrates the dimensions and shape of a first area of the resist layer exposed to a selected intensity of radiation comprising rectangle 31, the dimensions and shape of a second area of the resist layer exposed to radiation comprising square 32 and the dimensions and shape of a third area of the resist layer exposed to radiation comprising square 33 having a smaller area than square 32. FIG. 8B shows the spatial arrangement of rectangle 31, square 32 and square 33 useful for making recessed features and embedded structures having multi-step, non-uniform cross sectional depth profiles and geometry. As shown in FIG. 8B, the exposed first, second and third areas are positioned so as to have an overlapping spatial configuration. Specifically, square 32 is positioned such that it entirely overlaps rectangle 31, and square 33 is positioned such that it entirely overlaps both rectangle 31 and square 32, as shown in FIG. 8B. This overlap configuration is particularly useful for making a recessed feature in the substrate having a multi-step depth profile.

In a specific embodiment, rectangle 31, square 32 and square 33 are patterned in the resist layer using a 33.33% dose of radiation, and are positioned to overlap in the manner shown in FIG. 8B. Overlapping region 34 is exposed to a 66.66% does of radiation and overlapping region 35 is exposed to a 100% dose radiation. Once lithographic patterning via exposure of rectangle 31, square 32 and square 33 to selected intensities of radiation is completed, the patterned resist layer is subsequently developed so as to generate a recessed feature in the layer of resist having a multi-step non-uniform depth profile.

FIG. 9 provides a schematic illustrating additional processing steps of methods of the present invention for making Dual Damascene profile and an embedded multilevel interconnect structure having a multi-step cross sectional geometry, including development, transfer, stripping and deposition steps. FIG. 9A provides a cross sectional view of the resist layer 5 provided on the substrate 4 undergoing processing. As discussed in the context of FIG. 8, resist layer 5 is lithographically patterned using overlapping exposure of first, second and third areas corresponding to rectangle 31, square 32 and square 33. FIG. 9B shows a cross sectional view the resist layer 5 and substrate 4 upon developing the patterned resist layer 5, wherein developing removes material from the patterned resist layer 5 in first, second and third areas exposed to radiation.

As shown in FIG. 9B, the non-overlapping area of the first exposed area corresponding rectangle 31 that received a net 33.33% dose of radiation is reduced to a two thirds of the original thickness due to incomplete removal of resist during developing. The overlapping area 34 (See, FIG. 8B) reduced to a third of the original thickness, and the overlapping area 35 (See, FIG. 8B) is completely developed and, hence, resist is completely removed along the entire thickness of the resist layer 5 in this region. As a result of development, therefore, a region of the substrate 4 is exposed corresponding to the overlapping area of patterned first, second and third areas. The result of developing, as shown in FIG. 9B, is generation of a recessed feature 22 in the resist layer 5 having a multi-step non-uniform depth profile.

FIG. 9C schematically illustrates a transfer process of the present invention wherein recessed feature 22 in the resist layer 5 is transferred into substrate 4. As discussed in the context of FIGS. 2C, 4C and 5C, anisotropic etching is used to transfer recessed feature 22 into the substrate 4, thereby generating recessed feature 23 having a multi-step, non-uniform depth profile. After removal of remaining resist, for example via stripping, metal is deposited in recessed feature 22 so as to generate embedded structure 39 comprising an interconnect having a multi-step, non-uniform cross sectional geometry. As discussed above in the context of FIGS. 2F, 4F, and 5F, a CMP processing step may be employed to remove excess metal.

Example 1

Method of Making a Dual Damascene Profile

To demonstrate the capability of present methods using partial exposures to pattern Dual Damascene profiles for making Dual Damascene profiles, e-beam lithography was used for generating an overlapping exposure of a resist layer to radiation. A two inch silicon wafer was used as the substrate in our process. Silicon dioxide of thickness 200 nm was deposited on the silicon surface by PEVCD. In our experiments we did not deposit any etch stop materials in order to avoid unnecessary processing complexity. Once the wafer was cleaned with solvents, 260 nm of 950,000 4% in Anisole, PMMA was deposited on the substrate. Specifically, a 2600 Å layer of PMMA was spun onto the wafer. Once the resist was applied, the sample was heated to 200° C. in order to drive out any remaining solvent.

We then expose the substrate to an E-Beam, which first writes a rectangle at a dose of 50%. The rectangle has a width of 2 um. We then pattern a square of side 0.4 um with 50% dose. The square is patterned such that it completely overlaps the rectangle. Once the patterning was completed the sample was developed for 2 minutes in a solution of MIBK and IPA in a ratio of 1:2. The sample was then subsequently rinsed in IPA before being cleaned with Nitrogen. After development, the sample was etched by RIE for 20 minutes using Freon-13 gas.

The features that are not covered by resist are etched, eventually forming the vias. As a result of simultaneous etching of the resist, features that are covered by the resist that are of 50% or lower thickness are subsequently be etched as processing continues, thereby forming the trenches. The trenches etched are shallower than the vias. Once the etching is completed, the resist is stripped and the Dual Damascene profile can be seen in the silicon dioxide. We have obtained experimental results under these conditions where vias were etched to a depth of 2000 Å and trenches were etched to a depth of 710 Å.

Figure 10:
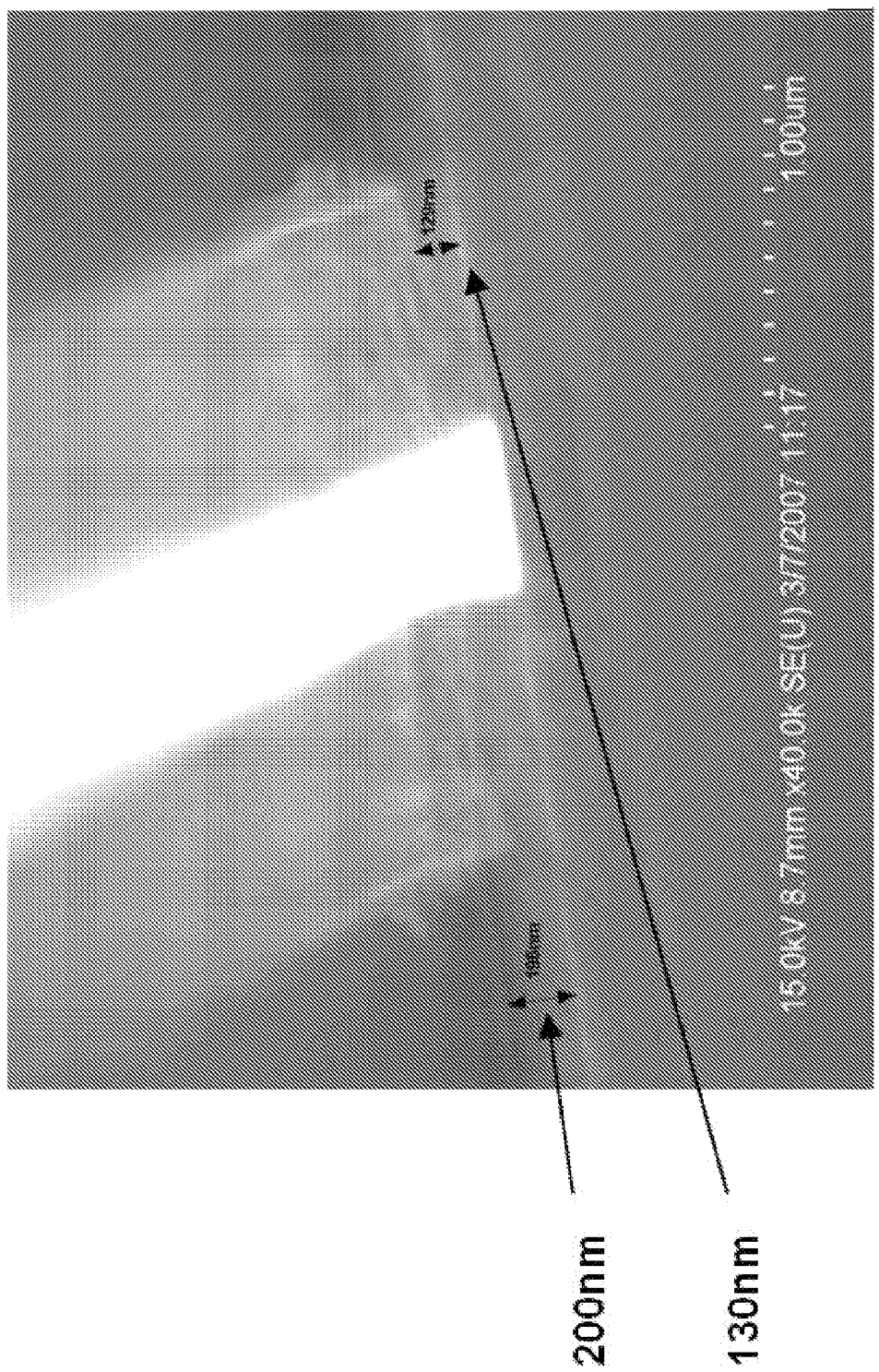
FIG. 10 shows a Scanning Electron Micrograph of a DD profile formed in silicon oxide using SPV lithography.

As the etching process was allowed to continue, at some stage the T-shaped profile in the resist was transferred to the underlying oxide layer. Once etching was completed, the resist was removed. FIG. 10 provide a Scanning Electron Micrograph (SEM) micrograph of the T-shaped Dual Damascene profile providing in the silicon dioxide layer. As seen in FIG. 10, a via that was 200 nm deep and a trench that was 70 nm deep is attained using this technique.

STATEMENTS REGARDING INCORPORATION BY REFERENCE AND VARIATIONS

U.S. Pat. No. 6,717,650, issued Apr. 6, 2004, corresponding to U.S. patent application Ser. No. 10/137,086, filed May 1, 2002, relates to methods and systems for sub-pixel voting lithography is hereby incorporated by reference in its entirety to the extent not inconsistent with the present description.

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Many of the molecules disclosed herein contain one or more ionizable groups [groups from which a proton can be removed (e.g., —COOH) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this invention for a given application. In specific applications, the selection of a given anion or cation for preparation of a salt may result in increased or decreased solubility of that salt.

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method for processing a substrate, said method comprising the steps of:
    providing a single layer of radiation sensitive material on at least a portion of said substrate, wherein said substrate comprises a layer stack having a first substrate layer, a first etch stop layer, a second substrate layer and a second etch stop layer, wherein said first substrate layer is positioned between said single layer of radiation sensitive material and said first etch stop layer, wherein said first etch stop layer is positioned between said first substrate layer and said second substrate layer and wherein said second substrate layer is positioned between said first etch stop layer and said second etch stop layer;
    exposing a first area of said single layer of radiation sensitive material to radiation having a first intensity, wherein said first intensity is a sub-threshold level of intensity;
    exposing a second area of said single layer of radiation sensitive material to radiation having a second intensity; wherein said second area at least partially overlaps said first area in an overlapping area and wherein said second intensity is a sub-threshold level of intensity; wherein said steps of exposing said first area and said second area of said single layer of radiation sensitive material are performed using maskless lithography;
    developing said single layer of radiation sensitive material by removing material from regions of said single layer of radiation sensitive material corresponding to the first and second areas, thereby generating a recessed feature having a first non-uniform depth profile in said single layer of radiation sensitive material;
    transferring at least a portion of said recessed feature having said first non-uniform depth profile in said single layer of radiation sensitive material into said first substrate layer, thereby opening up a first opened up region of said first etch stop layer;
    removing material from said first opened up region of said first etch stop layer, thereby opening up a second opened up region of said second substrate layer;
    transferring at least a portion of said recessed feature having said first non-uniform depth profile in said single layer of radiation sensitive material into said second substrate layer, thereby opening up a third opened up region of said second etch stop layer; and
    removing material from said third opened up region of said second etch stop layer;
    said transferring and removing steps generating a recessed feature having a second non-uniform depth profile in said substrate, thereby processing said substrate.

2. The method of claim 1 wherein said recessed feature having said second non-uniform depth profile is an integrated trench and via structure in said substrate.

3. The method of claim 1 wherein said recessed feature having said second non-uniform depth profile is a Dual Damascene profile in said substrate.

4. The method of claim 1 wherein said overlapping area is exposed to a cumulative intensity of radiation equal to a sum of said first and second intensities.

5. The method of claim 4 wherein said cumulative intensity is between 2 and 10 times larger than said first intensity or said second intensity.

6. The method of claim 1 wherein said first and second intensities are large enough such that said overlapping area is exposed to a cumulative intensity of radiation large enough to provide complete removal of radiation sensitive material along an entire thickness of said single layer of radiation sensitive material corresponding to said overlapping area upon said developing step, thereby opening up a portion of said substrate in said overlapping area.

7. The method of claim 1 wherein portions of said first area and second area do not overlap in a non-overlapping area; wherein said first intensity and said second intensity are low enough such that said non-overlapping area is exposed to intensities of radiation that provide only partial removal of radiation sensitive material along a thickness of said single layer of radiation sensitive material corresponding to said non-overlapping area upon said developing step.

8. The method of claim 1 wherein said first intensity is provided uniformly across said first area, and wherein said second intensity is provided uniformly across said second area.

9. The method of claim 1 wherein said first area is selected from the range of 100 nanometers$^2$ to 500 microns$^2$, wherein said second area is selected from the range of 100 nanometers$^2$ to 500 microns$^2$, and wherein said overlapping area is selected from the range of 100 nanometers$^2$ to 100 microns$^2$.

10. The method of claim 1 wherein said overlapping area is between 2 and 10 times smaller than a sum of said first area and said second area.

11. The method of claim 1 wherein said second area of said single layer of radiation sensitive material overlaps completely with said first area of said single layer of radiation sensitive material.

12. The method of claim 1 wherein said developing step comprises dissolving at least a portion of said single layer of radiation sensitive material corresponding to said first and second areas along a thickness of said single layer of radiation sensitive material.

13. The method of claim 1 wherein depths of said recessed feature having said first non-uniform depth profile are selected from the range of 10 nanometers to 10 microns.

14. The method of claim 1 wherein one or more physical dimensions of said recessed feature having said first non-uniform depth profile are selected from the range of 10 nanometers to 500 microns.

15. The method of claim 1 wherein said transferring steps comprise removing material from said single layer of radiation sensitive material and removing material from said substrate.

16. The method of claim 15 wherein said transferring steps comprise anisotropically etching said single layer of radiation sensitive material and said substrate.

17. The method of claim 15 wherein said transferring steps comprise the step of simultaneously removing material from said single layer of radiation sensitive material and said substrate.

18. The method of claim 15 wherein said transferring steps are independently carried out using a technique selected from the group consisting of reactive ion etching, wet etching, dry etching, photoablation, ion milling, reactive ion beam etching (RIBE), chemically assisted reactive ion beam etching (CAIBE), and plasma etching (PE).

19. The method of claim 1 wherein said second non-uniform depth profile is different from that of said first non-uniform depth profile.

20. The method of claim 1 wherein a maximum depth of said second non-uniform depth profile is 1 to 10 times that of a maximum depth of said first non-uniform depth profile.

21. The method of claim 1 wherein depths of said recessed feature having said second non-uniform depth profile are selected from the range of 10 nanometers to 10 microns.

22. The method of claim 1 wherein one or more physical dimensions of said recessed feature having said second non-uniform depth profile are selected from the range of 10 nanometers to 500 microns.

23. The method of claim 1 wherein said radiation is selected from the group consisting of electromagnetic radiation, electrons and ions.

24. The method of claim 1 wherein said exposing steps are carried out using a technique selected from the group consisting of: sub-pixel voting lithography, electron beam lithography, optical lithography, i-line lithography, deep ultraviolet light lithography, X-ray lithography, extreme UV lithography, ion beam lithography and optical maskless lithography using spatial light modulators.

25. The method of claim 1 wherein said radiation-sensitive material is a resist.

26. The method of claim 1 wherein said radiation-sensitive material is selected from the group consisting of: an electron-beam resist, a negative photoresist, and a positive photoresist.

27. The method of claim 1 further comprising the step of removing said single layer of radiation sensitive material after said transferring steps.

28. The method of claim 1 further comprising the step of exposing one or more additional areas of said single layer of radiation sensitive material to radiation having a selected intensity; wherein said one or more additional areas of said single layer of radiation sensitive material overlap said first area, said second area or both of said first and second areas; wherein said first non-uniform depth profile of said recessed feature in said single layer of radiation sensitive material is a multi-step depth profile; and wherein said second non-uniform depth profile of said recessed feature in said substrate is a multi-step depth profile.

29. The method of claim 1 further comprising the step of exposing one or more additional areas of said single layer of radiation sensitive material to radiation having a third intensity; wherein said one or more additional areas of said single layer of radiation sensitive material do not overlap either said first area or said second area; wherein said developing step generates one or more additional recessed features having a third uniform depth profile in said single layer of radiation sensitive material, wherein said transferring and removing steps generate one or more additional recessed features having a fourth uniform depth profile in said substrate.

30. The method of claim 29 wherein said third intensity is substantially equal to said first intensity or said second intensity or wherein said third intensity is substantially equal to a cumulative intensity of radiation equal to a sum of said first and second intensities.

31. The method of claim 29 wherein said one or more additional recessed features in said substrate comprises one or more trench structures.

32. The method of claim 1 further comprising the steps of:
exposing a third area of said single layer of radiation sensitive material to radiation having a third intensity, wherein said third area does not overlap said first area and second area;
exposing a fourth area of said single layer of radiation sensitive material to radiation having a fourth intensity; wherein said fourth area of said single layer of radiation sensitive material at least partially overlaps said third area in an overlapping area; and
wherein said developing step generates an additional recessed feature in said single layer of radiation sensitive material, said additional recessed feature in said single layer of radiation sensitive material having a third non-uniform depth profile; and wherein said transferring and removing steps generate an additional recessed feature in said substrate, said additional recessed feature in said substrate having a fourth non-uniform depth profile.

33. The method of claim 32 wherein said third intensity does not equal said first intensity, wherein said fourth intensity does not equal said second intensity, or wherein both said third intensity does not equal said first intensity and said fourth intensity does not equal said second intensity.

34. The method of claim 33 wherein said recessed feature having said second non-uniform depth profile is a first integrated trench and via structure in said substrate, and wherein said additional recessed feature having said fourth non-uniform depth profile is a second integrated trench and via structure in said substrate, said first integrated trench and via structure having a different depth profile than that of said second integrated trench and via structure.

35. The method of claim 1 wherein said substrate comprises a material selected from the group consisting of: a dielectric material, a semiconductor and a metal.

36. The method of claim 1 wherein said substrate is a device substrate prepatterned with components of an integrated electronic circuit.

37. The method of claim 1 comprising a method of making an integrated circuit.

38. The method of claim 1 comprising a method of making a device selected from the group consisting of a transistor or array thereof, memory device, sensor, diode or array thereof, liquid crystal device, display device, optical source, microprocessor, a microfluidic system, a nanofluidic system, a nanoelectromechanical system, a microelectromechanical system, a wave guide, an optical system, an electro-optical system and interconnect structure.

39. The method of claim 1, wherein said substrate comprises a dielectric stack.

40. The method of claim 1, wherein said first and second layers of said substrate comprise silicon dioxide and wherein said first and second etch stop layers comprise silicon nitride.

41. A method for processing a substrate, said method comprising the steps of:
providing a single layer of radiation sensitive material on at least a portion of said substrate, wherein said substrate comprises a layer stack having a first substrate layer, a first etch stop layer, a second substrate layer and a second etch stop layer, wherein said first substrate layer is positioned between said single layer of radiation sensitive material and said first etch stop layer, wherein said first etch stop layer is positioned between said first substrate layer and said second substrate layer and wherein said second substrate layer is positioned between said first etch stop layer and said second etch stop layer;
exposing a first area of said single layer of radiation sensitive material to radiation having a first intensity, wherein said first intensity is a sub-threshold level of intensity;
exposing a second area of said single layer of radiation sensitive material to radiation having a second intensity; wherein said second area at least partially overlaps said first area in an overlapping area and wherein said second intensity is a sub-threshold level of intensity; wherein said steps of exposing said first area and said second area of said single layer of radiation sensitive material are performed using maskless lithography;
developing said single layer of radiation sensitive material by removing material from regions of said single layer of radiation sensitive material corresponding to the first and second areas, thereby generating a recessed feature having a first non-uniform depth profile in said single layer of radiation sensitive material;
transferring at least a portion of said recessed feature having said first non-uniform depth profile in said single layer of radiation sensitive material into said first substrate layer, thereby opening up a first opened up region of said first etch stop layer;
removing material from said first opened up region of said first etch stop layer, thereby opening up a second opened up region of said second substrate layer;
transferring at least a portion of said recessed feature having said first non-uniform depth profile in said single layer of radiation sensitive material into said second substrate layer, thereby opening up a third opened up region of said second etch stop layer; and
removing material from said third opened up region of said second etch stop layer;
said transferring and removing steps generating a recessed feature having a second non-uniform depth profile in said substrate, thereby processing said substrate; and
depositing material into said recessed feature having said second non-uniform depth profile, thereby generating a structure at least partially embedded in said substrate.

42. The method of claim 41 wherein said material deposited into said recessed feature having said second non-uniform depth profile is one or more materials selected from the group consisting of a conductor, a semiconductor and a dielectric material.

43. The method of claim 41 wherein said depositing step is carried out using a technique selected from the group consisting of: physical vapor deposition, chemical vapor deposition, ion beam sputtering deposition, plasma enhanced chemical thin film deposition, electron beam evaporation deposition, atomic layer deposition, and thermal evaporation deposition.

44. The method of claim 41 further comprising the step of etching said material deposited into said recessed feature, mechanically polishing said material deposited into said recessed feature, or chemical mechanical polishing said material deposited into said recessed feature or any combination of these, thereby generating a structure fully embedded in said substrate.

45. The method of claim 41 wherein said deposited material is one or more conductive materials, and wherein said structure comprises an electrical interconnect structure.

46. The method of claim 41, wherein said substrate comprises a dielectric stack.

47. The method of claim 41, wherein said first and second layers of said substrate comprise silicon dioxide and wherein said first and second etch stop layers comprise silicon nitride.

48. A method for processing a substrate, said method comprising the steps of:
providing a single layer of radiation sensitive material on at least a portion of said substrate, wherein said substrate comprises a layer stack having a first substrate layer, a first etch stop layer, a second substrate layer and a second etch stop layer, wherein said first substrate layer is positioned between said single layer of radiation sensitive material and said first etch stop layer, wherein said first etch stop layer is positioned between said first substrate layer and said second substrate layer and wherein said second substrate layer is positioned between said first etch stop layer and said second etch stop layer;
exposing a first area of said single layer of radiation sensitive material to radiation having a first intensity, wherein said first intensity is a sub-threshold level of intensity;
exposing a second area of said single layer of radiation sensitive material to radiation having a second intensity; wherein said second area at least partially overlaps said first area in an overlapping area, wherein said second intensity is a sub-threshold level of intensity and wherein said exposing steps are carried out using sub-pixel voting lithography; wherein said steps of exposing said first area and said second area of said single layer of radiation sensitive material are performed using maskless lithography;
developing said single layer of radiation sensitive material by removing material from regions of said single layer of radiation sensitive material corresponding to the first and second areas, thereby generating a recessed feature having a first non-uniform depth profile in said single layer of radiation sensitive material;
transferring at least a portion of said recessed feature having said first non-uniform depth profile in said single layer of radiation sensitive material into said first substrate layer, thereby opening up a first opened up region of said first etch stop layer;
removing material from said first opened up region of said first etch stop layer, thereby opening up a second opened up region of said second substrate layer;
transferring at least a portion of said recessed feature having said first non-uniform depth profile in said single layer of radiation sensitive material into said second substrate layer, thereby opening up a third opened up region of said second etch stop layer; and removing material from said third opened up region of said second etch stop layer;

said transferring and removing steps generating a recessed feature having a second non-uniform depth profile in said substrate, thereby processing said substrate.

49. The method of claim 48, wherein said substrate comprises a dielectric stack.

50. The method of claim 48, wherein said first and second layers of said substrate comprise silicon dioxide and wherein said first and second etch stop layers comprise silicon nitride.

51. The method of claim 48, wherein said removing steps independently comprise etching one of said first and second etch stop layers using an etchant different from an etchant used in at least one transferring step.

* * * * *